United States Patent
Nakayama et al.

(10) Patent No.: US 9,947,380 B2
(45) Date of Patent: Apr. 17, 2018

(54) ADJUSTABLE READ REFERENCE VOLTAGE TO REDUCE ERRORS IN MEMORY DEVICES

(71) Applicant: Toshiba Memory Corporation, Minato-ku, Tokyo (JP)

(72) Inventors: Masahiko Nakayama, Kawasaki Kanagawa (JP); Masashi Kawamura, Kawasaki Kanagawa (JP); Katsuhiko Hoya, Yokohama Kanagawa (JP); Mikio Miyata, Yokohama Kanagawa (JP); Minoru Amano, Sagamihara Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/267,093

(22) Filed: Sep. 15, 2016

(65) Prior Publication Data

US 2017/0263336 A1   Sep. 14, 2017

Related U.S. Application Data

(60) Provisional application No. 62/306,967, filed on Mar. 11, 2016.

(51) Int. Cl.
*G11C 11/16* (2006.01)
*G11C 29/44* (2006.01)
(Continued)

(52) U.S. Cl.
CPC .......... *G11C 11/16* (2013.01); *G11C 11/1655* (2013.01); *G11C 11/1657* (2013.01);
(Continued)

(58) Field of Classification Search
CPC .. G11C 29/44; G11C 11/1655; G11C 11/1673; G11C 11/1657; G11C 29/78; G11C 11/16; G11C 13/00
See application file for complete search history.

(56) References Cited

U.S. PATENT DOCUMENTS 6,442,063 B2   8/2002   Hartmann
7,075,813 B2   7/2006   Moriyama et al.
(Continued)

FOREIGN PATENT DOCUMENTS

JP    2003338199 A    11/2003
WO   2010125941 A1    11/2010

OTHER PUBLICATIONS

Related U.S. Appl. No. 62/130,490, First Named Inventor: Yoshiaki Osada, filed: Mar. 9, 2015, Title: "Semiconductor Storage Device".

*Primary Examiner* — Ajay Ojha
(74) *Attorney, Agent, or Firm* — Holtz Holtz & Volek PC

(57) ABSTRACT

According to one embodiment, a memory includes a magnetoresistive element, a reference cell, a sense amplifier comparing a first current flowing in the magnetoresistive element with a second current flowing in the reference cell, a first transistor having a first control terminal controlling a value of the first current, a second transistor having a second control terminal controlling a value of the second current, and a controller applying a first potential to the first control terminal and a second potential to the second control terminal in a first operation, and applying the first potential to the first control terminal and a third potential larger than the second potential to the second control terminal in a second operation.

16 Claims, 25 Drawing Sheets

(51) Int. Cl.
*G11C 29/00* (2006.01)
*G11C 13/00* (2006.01)
(52) U.S. Cl.
CPC .......... *G11C 11/1673* (2013.01); *G11C 13/00* (2013.01); *G11C 29/44* (2013.01); *G11C 29/78* (2013.01)

(56) References Cited

U.S. PATENT DOCUMENTS

| | | |
|---|---|---|
| 8,338,816 B2 | 12/2012 | Kanzawa et al. |
| 8,588,017 B2 | 11/2013 | Park et al. |
| 2012/0250402 A1* | 10/2012 | Song ................ G11C 13/0004 365/163 |
| 2013/0100725 A1* | 4/2013 | Kim ...................... G11C 5/063 365/148 |
| 2014/0063904 A1* | 3/2014 | Yon .................... G11C 13/004 365/148 |
| 2014/0269030 A1* | 9/2014 | Chih .................. G11C 11/1673 365/158 |
| 2015/0194194 A1* | 7/2015 | Arsovski ................ G11C 7/08 365/189.02 |

\* cited by examiner

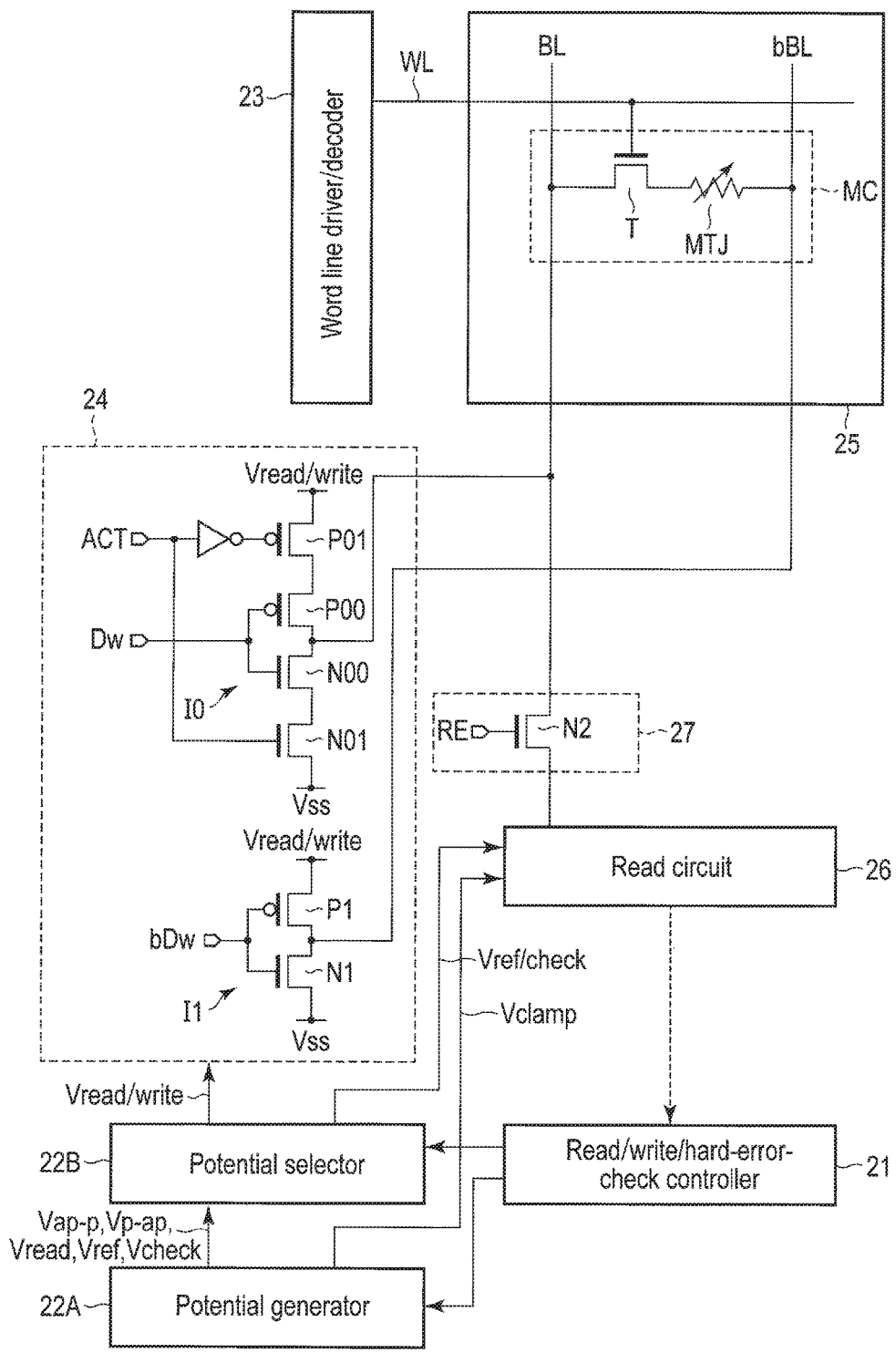
F I G. 3

| Operation mode | ACT | Dw | bDw | Vread/write | Vref/check |
|---|---|---|---|---|---|
| AP-write | 1 | 1 | 0 | Vp-ap | — |
| P-write | 1 | 0 | 1 | Vap-p | — |
| Read | 0 | — | 0 | Vread | Vref |
| Hard error check | 0 | — | 0 | Vread | Vcheck |
0 → Low level potential
1 → High level potential
F I G. 4
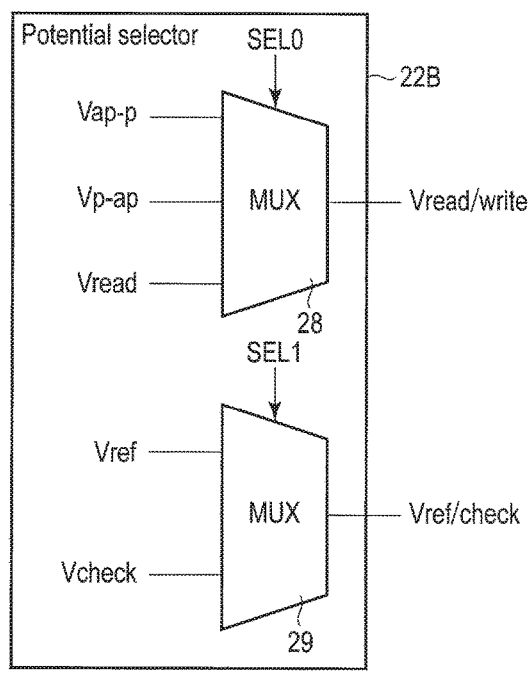
F I G. 5

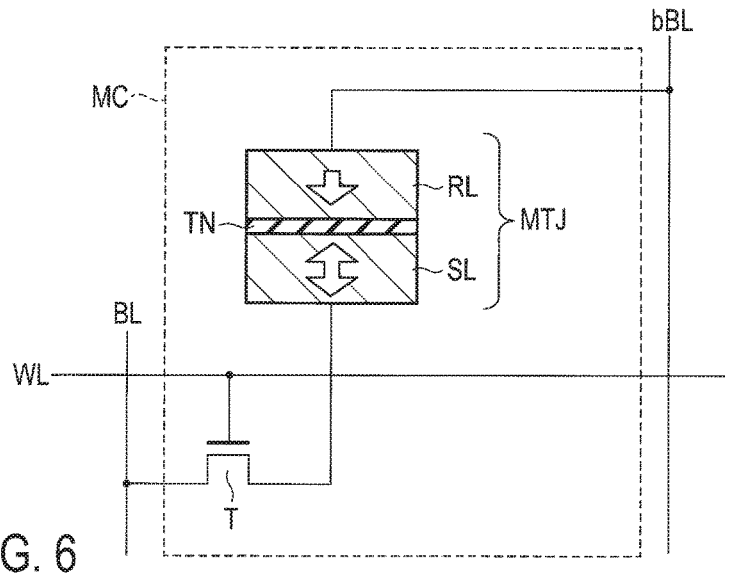
F I G. 6
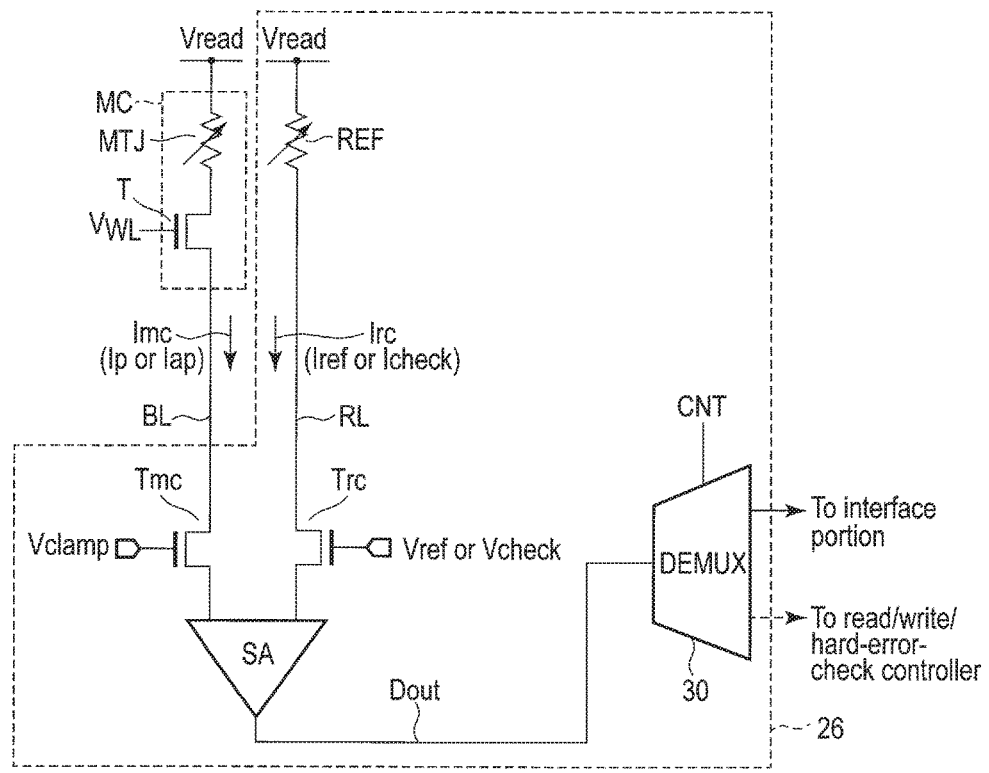
F I G. 7

| State of magnetoresistive element MTJ | Resistance |
|---|---|
| Antiparallel | Higher Rap |
| Parallel | Lower Rp |
| Hard error (Breakdown of TN) | Lowest $R_{HE}$ $R_{HE} < Rp < Rap$ |

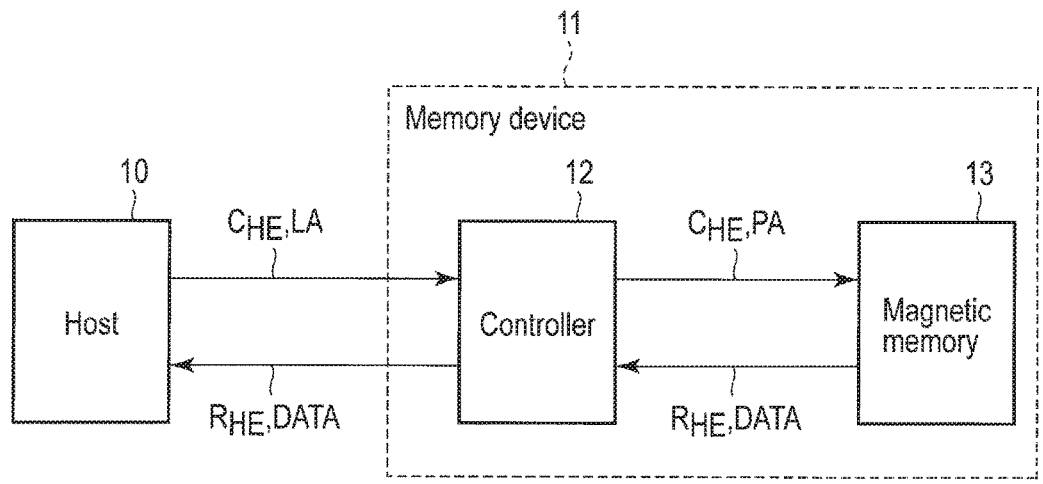
F I G. 14
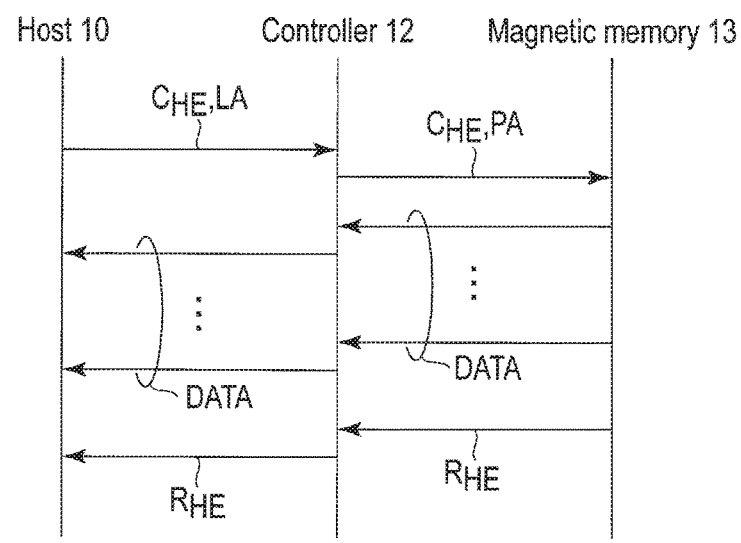
F I G. 15

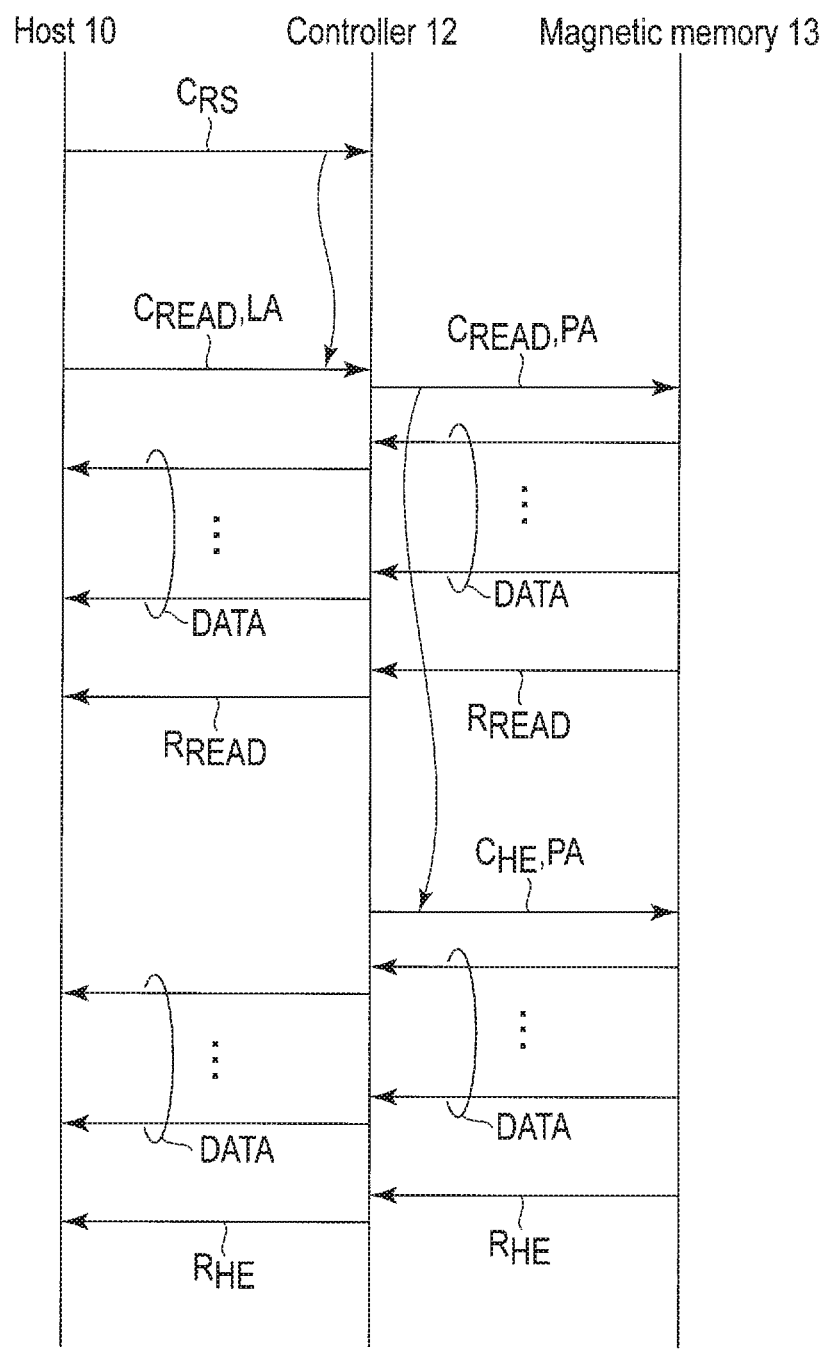
F I G. 18

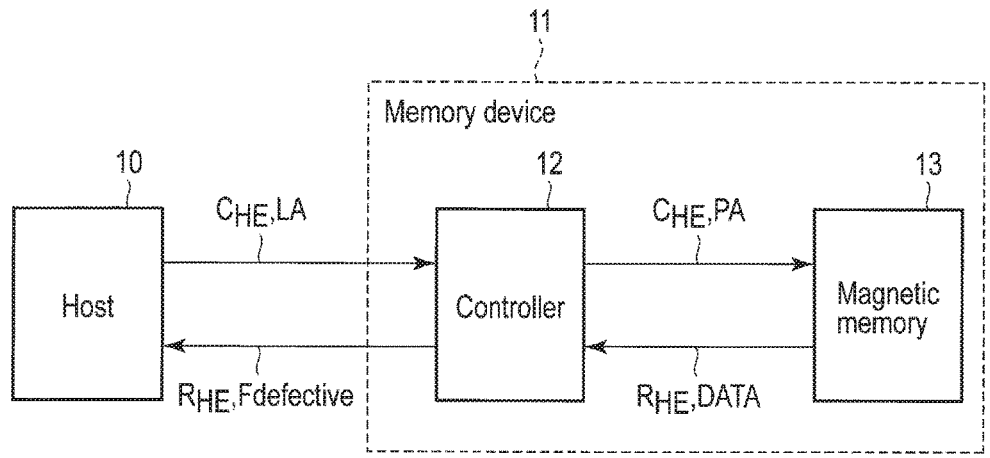
F I G. 20
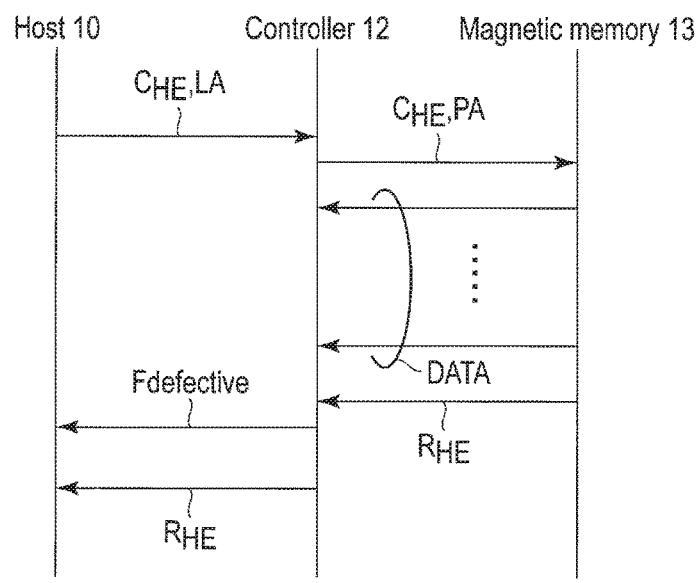
F I G. 21

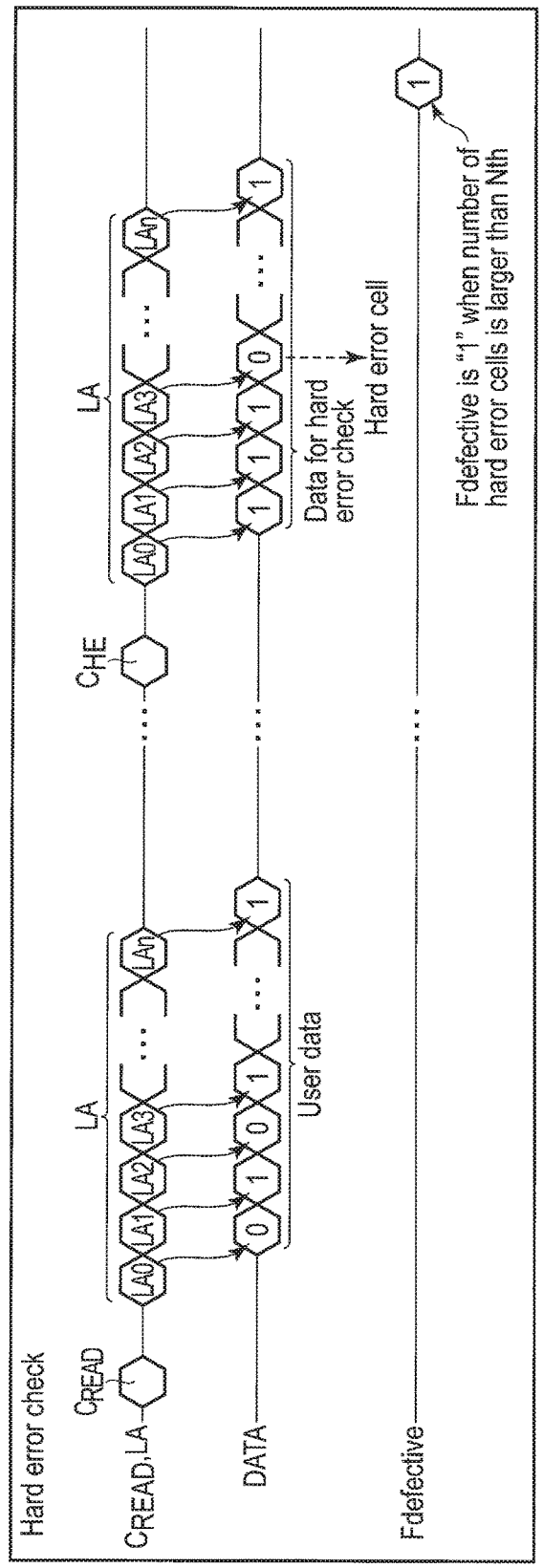
F I G. 25

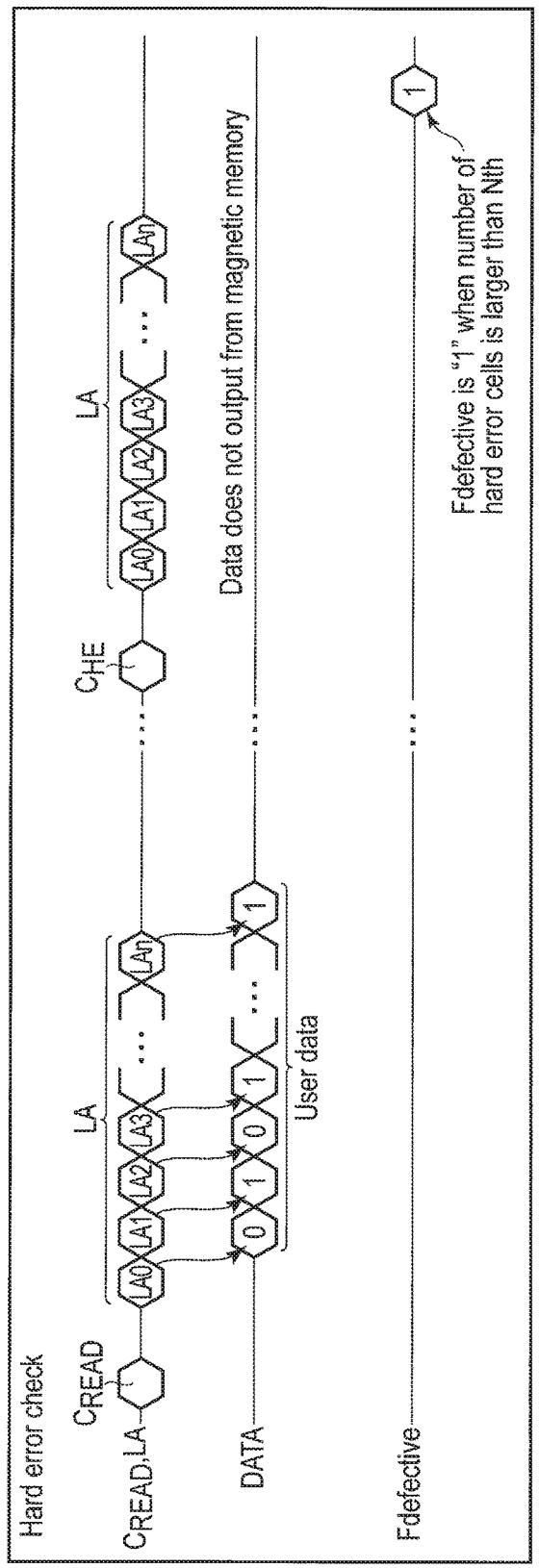
F I G. 31

| Counter | |
|---|---|
| Number of write times | N_write times |
| Number of hard error cells | N_hard error cells |

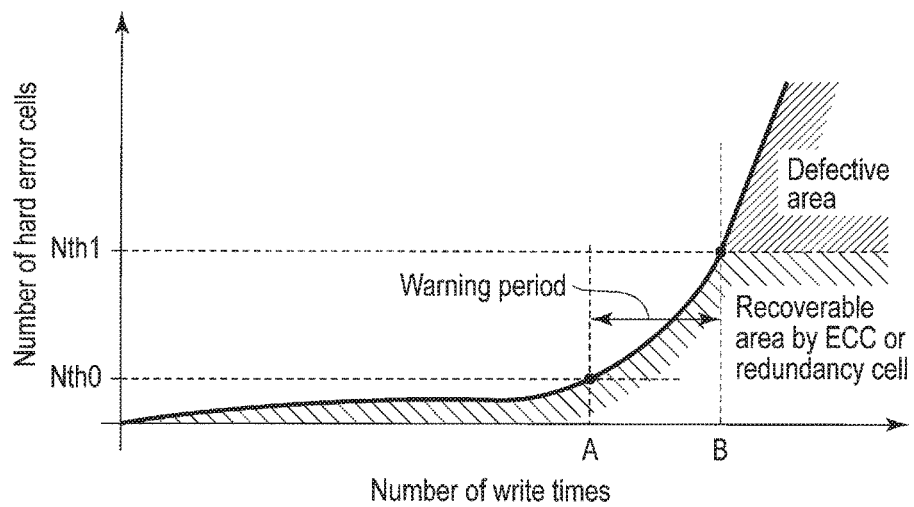
F I G. 34
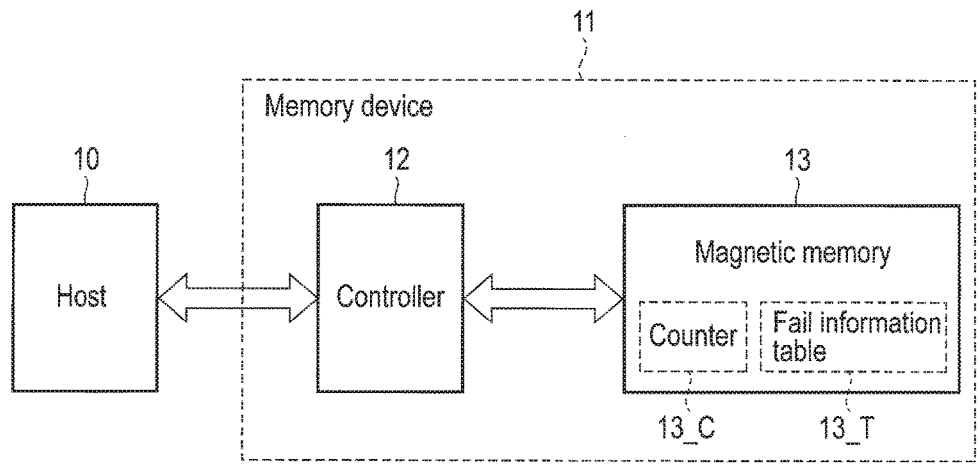
F I G. 35

13_C

| Counter | |
|---|---|
| Number of write times | N_write times |
| Number of read error cells | N_read error cells |
| Number of hard error cells | N_hard error cells |

13_T

| Fail information table | | |
|---|---|---|
| Fail address | | Category of error (Hard error cell is "1") |
| LA | PA | |
| LAa | PAa | 1 |
| LAb | PAb | 0 |
| LAc | PAc | 1 |
| LAd | PAd | 0 |
| ⋮ | ⋮ | ⋮ |

F I G. 36

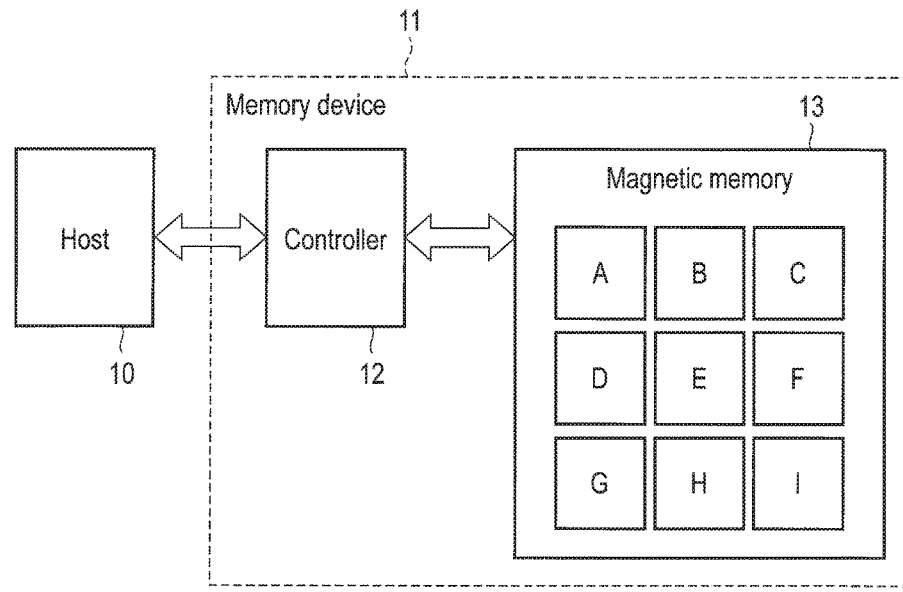
F I G. 38
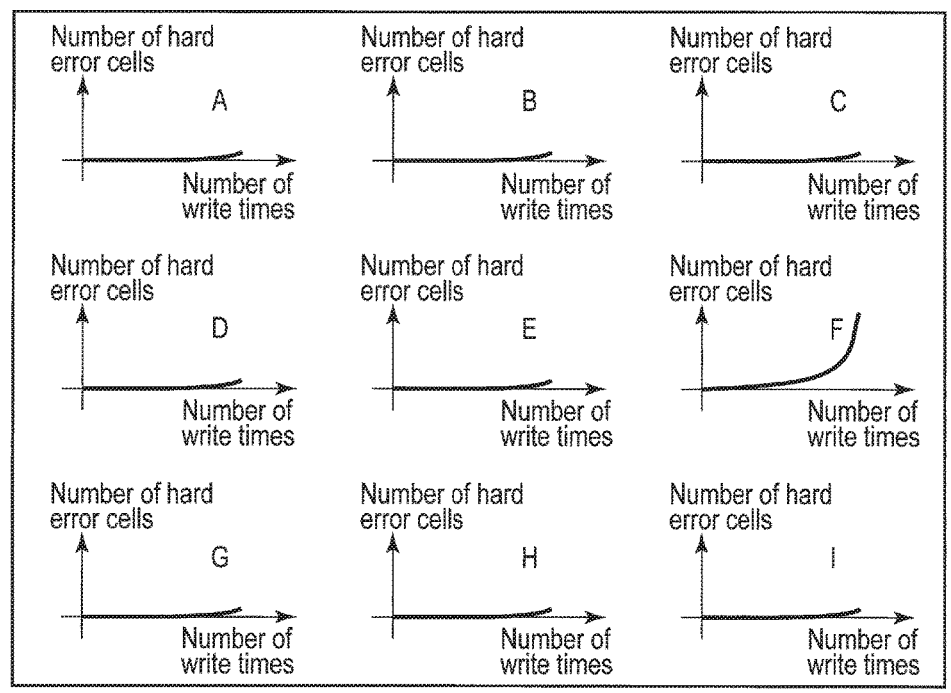
F I G. 39

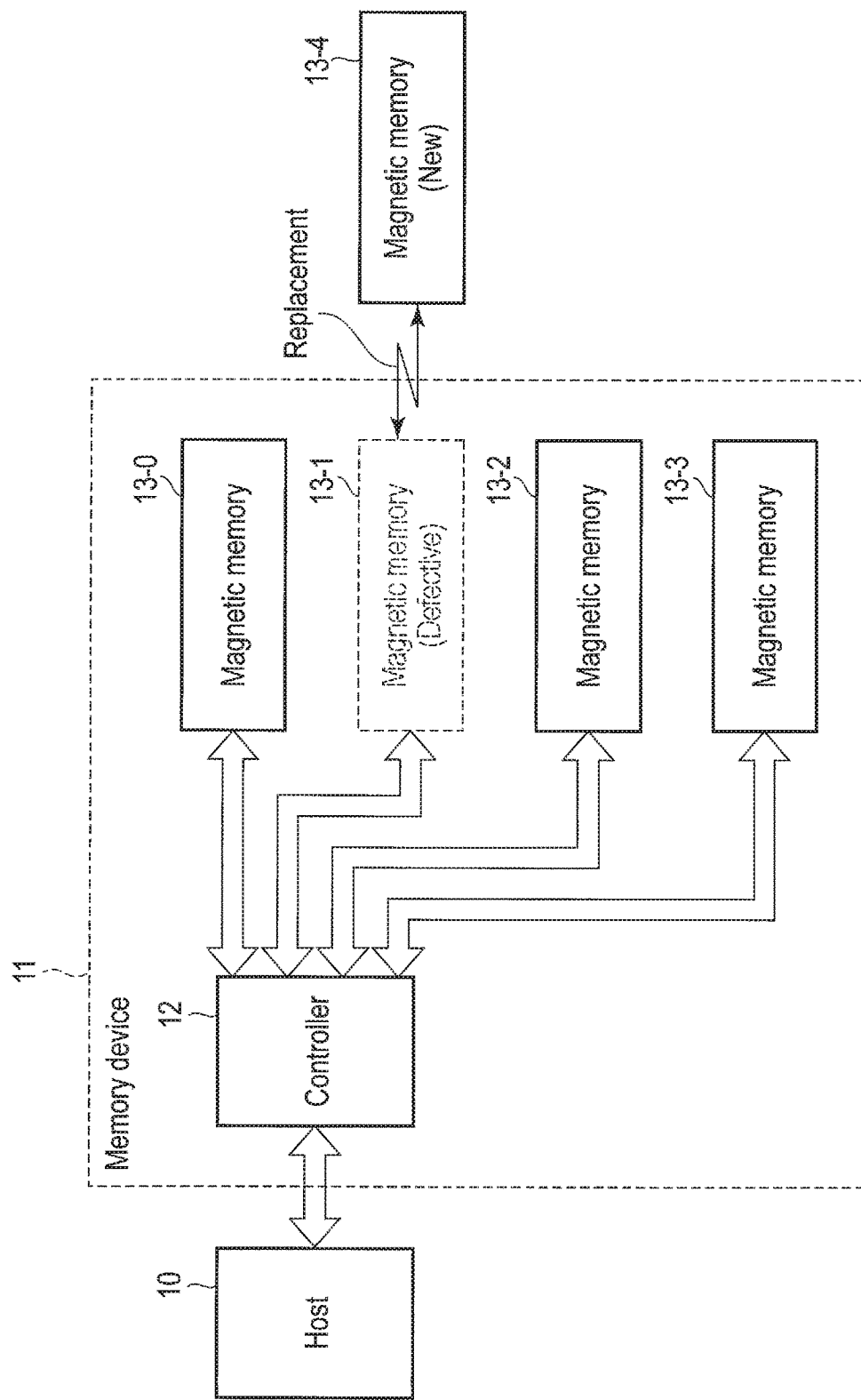
F I G. 40

US 9,947,380 B2

ADJUSTABLE READ REFERENCE VOLTAGE TO REDUCE ERRORS IN MEMORY DEVICES

CROSS-REFERENCE TO RELATED APPLICATIONS

This application claims the benefit of U.S. Provisional Application No. 62/306,967, filed Mar. 11, 2016, the entire contents of which are incorporated herein by reference.

FIELD

Embodiments described herein relate generally to a memory and a memory device.

BACKGROUND

In a memory device comprising a controller and a magnetic memory which is controlled by the controller, there is a case where data read from the magnetic memory has an incorrect value because of a soft error or a hard error.

The soft error is an error which is due to an operating condition, and can be corrected by, for example, an error correction circuit (ECC). The hard error is an error caused by a defective cell generated in an initial period or because of deterioration with age, and recovery from the error can be achieved by, for example, redundancy replacement in which the defective cell is replaced with a redundancy cell. Also, data of a defective cell which cannot be replaced by redundancy replacement can be corrected by the ECC.

However, if the number of cells having a hard error exceeds a predetermined number, error correction cannot be executed even by redundancy replacement or ECC, as a result of which the magnetic memory is dealt with as a defective one.

BRIEF DESCRIPTION OF THE DRAWINGS

FIG. 3 is a view showing a main portion of the magnetic memory as shown in FIG. 2.
FIG. 4 is a view showing relationships between an operation mode, ACT, Dw, bDW, Vread/write and Vref/check.
FIG. 5 is a view showing an example of a potential selector.
FIG. 6 is a view showing an example of a memory cell.
FIG. 7 is a view showing an equivalent circuit at the time of checking a read/hard error in the magnetic memory as shown in FIG. 3.
FIGS. 14 to 19 are views showing a first application.
FIGS. 20 to 25 are views showing a second application.
FIGS. 26 to 31 are views showing a third application.
FIGS. 32 to 34 are views showing a fourth application.
FIGS. 35 to 37 are views showing a fifth application.
FIGS. 38 and 39 are views showing a sixth application.
FIG. 40 is a view showing a seventh application.

DETAILED DESCRIPTION

In general, according to one embodiment, a memory comprises: a magnetoresistive element; a reference cell; a sense amplifier comparing a first current flowing in the magnetoresistive element with a second current flowing in the reference cell; a first transistor having a first control terminal controlling a value of the first current; a second transistor having a second control terminal controlling a value of the second current; and a controller applying a first potential to the first control terminal and a second potential to the second control terminal in a first operation, and applying the first potential to the first control terminal and a third potential larger than the second potential to the second control terminal in a second operation.

Embodiments will be described hereinafter with reference to the accompanying drawings.

(Embodiments)

Figure 1:
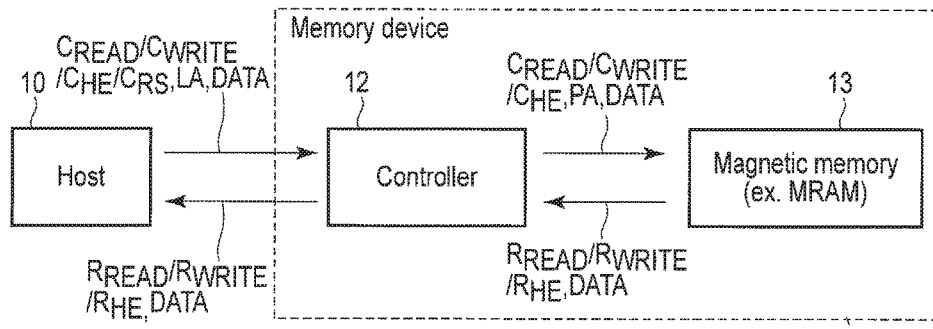
FIG. 1 is a view showing an example of a memory system.

FIG. 1 shows an example of a memory system.

A memory system to which an embodiment can be applied comprises a host 10 and a memory device 11. The host 10 is an electronic device (to be more exact, a processor in the electronic device) such as a personal computer or a portable terminal. The host 10 may be an imaging device such as a digital still camera or a video camera, or may be a tablet computer, a smartphone, a game console, a car navigation system, a printer, a scanner or a server system.

The memory device 11 is a storage device connectable to the host 10, for example, a solid-state drive (SSD), a USB memory or a memory card. The memory device 11 comprises a controller 12 and a magnetic memory 13 which is controlled thereby. The controller 12 controls data read and write operations on the magnetic memory 13. The magnetic memory 13 is, for example, a magnetic random access memory (MRAM).

The magnetic memory 13 may be a storage memory for storing user data for a long period or a cache memory for temporarily storing user data. Furthermore, for example, in the case where the magnetic memory 13 is used as the storage memory, if a translation table for translating a logical address LA into a physical address PA is needed, the magnetic memory 13 may be made capable of storing the translation table.

The logical address LA is address information indicating the position of user data in an address space managed by the host 10, and the physical address PA is address information indicating a location in the magnetic memory at which the user data is actually stored.

The host 10 transfers, for example when writing user data to the memory device 11, write command $C_{WRITE}$, logical address LA and data DATA to the memory device 11. The controller 12 in the memory device 11 transfers write command $C_{WRITE}$ and data to the magnetic memory 13. Also, the controller 12 translates a logical address LA into a physical address PA based on, for example, the translation table, and transfers the physical address PA to the magnetic memory 13. As a result, the data DATA is written to the magnetic memory 13.

When the write operation on the magnetic memory 13 is completed, for example, replay $R_{WRITE}$ indicating a write completion is transferred from the magnetic memory 13 to the host 10 through the controller 12.

For example, in order to read user data from the memory device 11, the host 10 transfers read command $C_{READ}$ and a logical address LA to the memory device 11. The controller 12 in the memory device 11 transfers read command $C_{READ}$ to the magnetic memory 13. Also, the controller 12 translates the logical address LA into a physical address PA based on, for example, the translation table, and transfers the physical address PA to the magnetic memory 13. As a result, data DATA is read from the magnetic memory 13.

When the read operation on the magnetic memory 13 is completed, for example, reply $R_{READ}$ indicating read completion is transferred from the magnetic memory 13 to the host 10 through the controller 12.

For example, in order to check a hard error or errors in the magnetic memory 13, the host 10 transfers hard error check command $C_{HE}$ to the memory device 11. The hard error in the magnetic memory 13 means an error in which a memory cell in the magnetic memory 13 changes into a defective cell because of deterioration with age or the like. A hard error check means detection of the positions and the number of cells having a hard error (which will be hereinafter referred to as hard error cells), etc.

If the number of hard error cells is greater than a predetermined value, errors cannot be corrected even by the ECC or redundancy replacement, and the magnetic memory is dealt with as a defective one. It is therefore important to check a hard error or errors. Such a hard error check is a function specific to the embodiment.

Upon reception of hard error check command $C_{HE}$, the controller 12 instructs the magnetic memory 13 to check a hard error or errors in the magnetic memory 13. Upon reception of hard error check command $C_{HE}$, the magnetic memory 13 executes a hard error check.

Memory cells (normal cells) in the magnetic memory 13 are resistance-change elements, for example, magnetoresistive elements, and can store data in accordance with whether their resistance values are high or low. On the other hand, cells having a hard error are featured in that their resistance values are less than the resistance values of normal cells.

Therefore, for example, it suffices that a read operation for discriminating between the resistance values of normal cells and those of hard error cells is executed, as the hard error check. This will be described later.

Although the hard error check is executed in response to a command from the host 10, the controller 12 may execute the hard error check periodically or at a predetermined timing, according to its own determination.

For example, the controller 12 may execute the hard error check when the memory system is powered on or off or at a predetermined timing between the on-state and off-state of the system. Also, in the case where the controller 12 receives read command $C_{READ}$ from the host 10, it may execute the hard error check after executing the read operation. In this case, it is preferable that register set command $C_{RS}$ be set, and when register set command $C_{RS}$ is transferred from the host 10 to the memory device 11, the hard error check be executed.

Furthermore, the hard error check may be executed on the entire magnetic memory 13 (all the memory cells of a memory cell array 25) or a specific area in the magnetic memory 13 (some of the memory cells of the memory cell array 25).

When the hard error check on the magnetic memory 13 is completed, for example, reply $R_{HE}$ indicating hard error check completion is transferred from the magnetic memory 13 to the host 10 through the controller 12.

Figure 2:
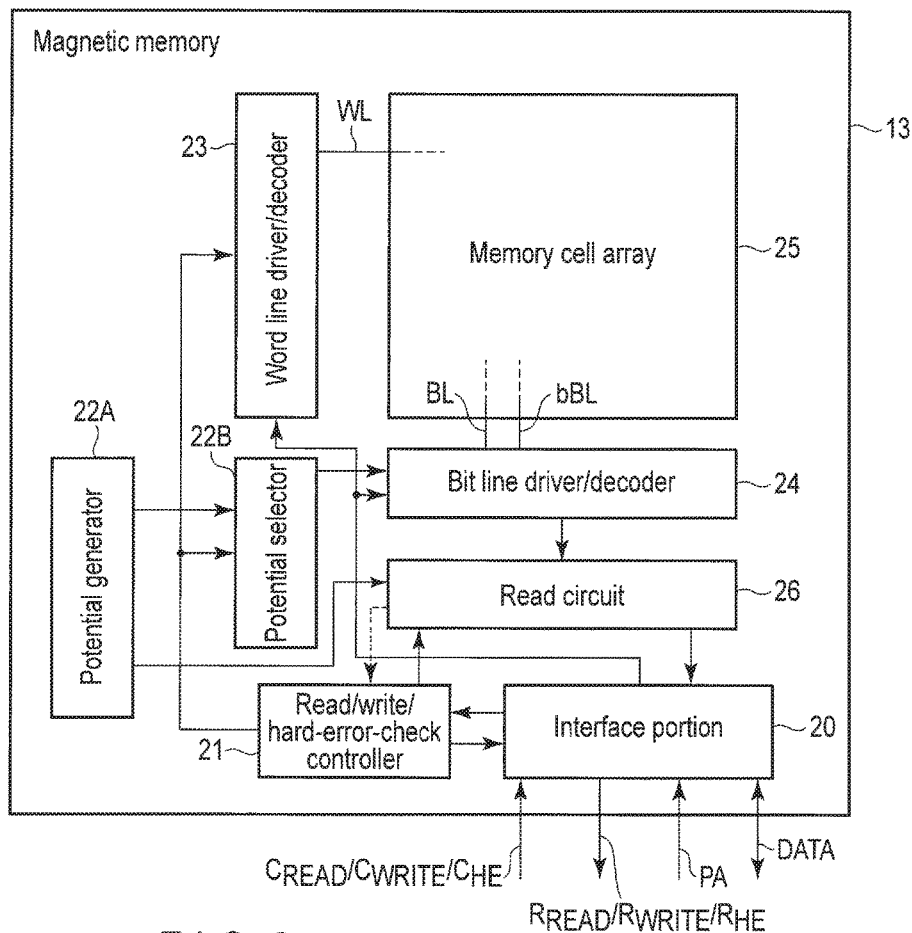
FIG. 2 is a view showing an example of a magnetic memory.

FIG. 2 shows an example of the magnetic memory.

The magnetic memory 13 is, for example, an MRAM. The magnetic memory 13 comprises an interface unit 20, a read/write/hard error check controller 21, a potential generator 22a, a potential selector 22B, a word-line driver/decoder 23, a bit-line driver/decoder 24, the memory cell array 25 and a read circuit 26.

Upon reception of read/write/hard error check command $C_{READ}/C_{WRITE}/C_{HE}$, the interface unit 20 notifies the read/write/hard error check controller 21 of reception of read/write/hard error check command $C_{READ}/C_{WRITE}/C_{HE}$. Also, the interface unit 20 transfers a physical address PA to the word-line driver/decoder 23 and the bit-line driver/decoder 24.

The read/write/hard error check controller 21 controls the read operation/write operation/hard error check operation.

The read operation is an operation of accessing the memory cell array 25 and outputting data DATA read from the memory cell array 25 to the outside of the magnetic memory 13. In the read operation, the read circuit 26 is activated. The write operation is an operation of accessing the memory cell array 25 and writing write data to the memory cell array 25.

The hard error check operation is an operation of accessing the memory cell array 25 and checking whether a hard error is present or absent, based on the data DATA read from the memory cell array 25. In the hard error check operation, the read circuit 26 is activated.

Whether a hard error is present or absent can also be checked in the magnetic memory 13. Also, it can be checked outside the magnetic memory 13; that is, it can be done by the host 10 or the controller 12 as shown in FIG. 1.

In the case where whether a hard error is present or absent is checked in the magnetic memory 13, for example, in the hard error check operation, the data read from the memory cell array 25 is not output to the outside of the magnetic memory 13; i.e., it is transferred to the read/write/hard error check controller 21 (doted arrow). In this case, the read/write/hard error check controller 21 manages the number of hard error cells, the positions thereof, etc.

In the case where whether a hard error is present or absent is checked outside the magnetic memory 13, for example, in the hard error check operation, the data read from the memory cell array 25 is output to the outside of the magnetic memory 13. In this case, for example, the host 10 or the controller 12 as shown in FIG. 1 manages the number of hard error cells, the positions thereof, etc.

When the read/write/hard error check controller 21 determines that the read/write/hard error check operation is completed, it notifies the interface unit 20 of completion of the read/write/hard error check operation. The interface unit 20 outputs reply $R_{READ}/R_{WRITE}/R_{HE}$ indicating the read/write/hard error check completion to the outside of the magnetic memory 13.

The potential generator 22A generates a plurality of potentials to be applied to the read/write/hard error check operation. For example, in the read/write/hard error check operation, the potential selector 22B selects a potential to be transferred to bit lines BL and bBL and a potential to be transferred to the read circuit 26 from the potentials generated by the potential generator 22A, based on a selection signal from the read/write/hard error check controller 21.

The word-line driver/decoder 23 selects one of a plurality of word lines WL. The bit-line driver/decoder 24 selects, for example, a pair of bit lines BL and bBL from a plurality of bit line pairs. That is, the word-line driver/decoder 23 and the bit-line driver/decoder 24 are access circuits which can access the memory cell array 25 in the read/write/hard error check operation.

FIG. 3 shows a main portion of the magnetic memory as shown in FIG. 2. FIG. 4 shows in the magnetic memory as shown in FIG. 3, relationships between an operation mode, an activation signal ACT, input signals Dw and bDw, potential Vread/write to be transferred to bit lines BL and bBL and potential Vref/check to be transferred to the read circuit 26.

The memory cell array 25 comprises select transistors (for example, field effect transistors [TFTs]) T to be connected in series and magnetoresistive elements MTJ. To be more specific, a control terminal (gate) of a select transistor T is connected to a word line WL, and one of two current terminals of the select transistor T is connected to a bit line BL. A magnetoresistive element MTJ is a two-terminal element. One of the terminals of the magnetoresistive element MTJ is connected to the other of the two current terminals of the select transistor T, and the other terminal of the magnetoresistive element MTJ is connected to a bit line bBL.

The bit-line driver/decoder 24 comprises inverter circuit (driver) I0 connected to the bit line BL and inverter circuit (driver) I1 connected to the bit line bBL. Inverter circuit I0 comprises P-channel transistors (FETs) P00 and P01 connected in series between first and second power supply terminals and N-channel transistors (FETs) N00 and N01 connected in series between the first and second power supply terminals. Inverter circuit I1 comprises P-channel transistor (FET) P1 and N-channel transistor (FET) N1 connected in series between the first and second power supply terminals.

Inverter I0 drives the bit line BL based on an input signal Dw, and inverter I1 drives the bit line bBL based on an input signal bDw. It should be noted that each of the activation signal ACT and the input signals Dw and bDw is a binary signal (a signal having either a low level or a high level), and the input signal bDw is an inversion signal of the input signal Dw.

Also, inverter circuit I0 enters an active state (operational state) when the activation signal ACT is at high level. In the write operation, the activation signal ACT is at high level, and inverter circuit I0 enters the active state. In the read/the hard error check operation, the activation signal ACT is at low level, and inverter circuit I0 enters a nonactive state (nonoperational state).

First power supply terminals of inverter circuits I0 and I1 are set at Vread/write, and second power supply terminals of inverter circuits I0 and I1 are set at Vss. For example, Vss is a ground potential, and Vread/write is a positive potential greater than Vss. Also, Vread/write is a potential selected by the potential selector 22B.

The potential selector 22B, for example, as shown in FIG. 5, comprises mutlplexers (MUXs) 28 and 29. The multiplexer 28, for example, selects one of three potentials Vap-p, Vp-ap and Vread based on select signal SEL0. The multiplexer 29, for example, selects one of two potentials Vref and Vcheck based on select signal SEL1.

Vap-p and Vp-ap are potentials to be applied in the write operation. Vap-p is a potential for changing, for example, the state of the magnetoresistive element MTJ from an antiparallel state to a parallel state. Vp-ap is a potential for changing, for example, the state of the magnetoresistive element MTJ from the parallel state to the antiparallel state.

It should be noted that the magnetoresistive element MTJ, for example, as shown in FIG. 6, comprises a storage layer (magnetic layer) SL, a reference layer (magnetic layer) RL and a nonmagnetic layer (insulating layer) TN, and the reference layer RL comprises a material or a structure, the magnetization direction of which is not easily reversed, as compared with the storage layer SL.

In FIG. 6, the magnetization directions of the storage layer SL and the reference layer RL are set to a direction (vertical direction) in which those layers are stacked, and the magnetization directions of the storage layer SL and the reference layer RL may be set to a direction (in-plane direction) intersecting the direction in which those layers are stacked. That is, the embodiment is applicable with the in-plane type magnetoresistive element in addition to the vertical type magnetoresistive element.

The storage layer SL comprises a magnetic material such as CoFeB (cobalt-iron-boron), FeB (iron-boron), Co-based alloy, or Fe-based alloy. The reference layer RL comprises a magnetic material such as CoFeB (cobalt-iron-boron), FeB (iron-boron), CoPt (cobalt-platinum), CoNi (cobalt-nickel), CoPd (cobalt-palladium), Co-based alloy, or Fe-based alloy. The nonmagnetic layer TN comprises an insulating layer such as MgO (magnesium oxide).

It should be noted that the composition ratio of each of materials described herein, such as CoFeB, FeB, CoPt, CoNi, CoPd and MgO, is not necessarily limited to 1:1:1 or 1:1. For example, if it is described that the storage layer SL comprises CoFeB, it means that the storage layer SL includes Co, Fe and B (it does not limit the composition ratio between Co, Fe and B), and if it is described that the nonmagnetic layer TN comprises MgO, it means that the nonmagnetic layer TN includes Mg and O (it does not limit the composition ratio between Mg and O).

The same is true of materials other than the above materials.

In such a magnetoresistive element MTJ, the parallel state means that the magnetization directions of the storage layer SL and the reference layer RL are the same as each other, and the antiparallel state means that the magnetization directions of the storage layer SL and the reference layer RL are opposite to each other.

The parallel state is, for example, a state in which the magnetoresistive element MTJ has a low resistance, and this state will be referred to as 0-state (a state in which data 0 is stored). The antiparallel state is, for example, a state in which the magnetoresistive element MTJ has a high resistance, and this state will be referred to as 1-state (a state in winch data 1 is stored).

In the write operation, if write data is 0 (P-write), for example, the multiplexer 28 selects Vap-p, and Vread/write is set to Vap-p. Furthermore, input signal Dw is set at 0 (low), and input signal bDw is set at 1 (high). Thus, Vap-p is applied to the bit line BL, and Vss is applied to the bit line bBL. Therefore, a write current flows from the bit line BL toward the bit line bBL in the magnetoresistive element MTJ, and the state of the magnetoresistive element MTJ is changed from the antiparallel state to the parallel state.

In the write operation, if the write data is 1 (AP-write), for example, the multiplexer 28 selects Vp-ap, and Vread/write is set to Vp-ap. Furthermore, input signal Dw is set at 1 (high), and input signal bDw is set at 0 (low). Thus, Vp-ap is applied to the bit line bBL, and Vss is applied to the bit line BL. Therefore, a write current flows from the bit line bBL toward the bit line BL in the magnetoresistive element MTJ, and the state of the magnetoresistive element MTJ is changed from the parallel state to the antiparallel state.

Vread is a potential to be applied in the read/hard error check operation. That is, Vread is a potential for reading the resistive state (antiparallel state/parallel state) of the magnetoresistive element MT. The value of Vread needs to be less than that of Vap-p and that of Vp-ap to prevent magnetization reversal of the storage layer at the time of executing the read operation.

In the read/hard error check operation, the multiplexer 28 selects Vread based on select signal SEL0, and Vread/write is set to Vread. Furthermore, since input signal bDw is set at 0 (low level), Vread is applied to the bit line bBL.

The bit line BL is connected to the read circuit 26 through a switch circuit 27. The switch circuit 27 comprises, for example, N-channel transistor (FET) N2. In the read/hard error check operation, a read enable signal RE is changed from low level to high level, and the bit line BL is thus electrically connected to the read circuit 26 through the switch circuit 27.

Therefore, in the read/hard error check operation, for example, a read current flows from the bit line (Vread) bBL toward the read circuit (Vss) 26 through the memory cell MC and the bit line BL, and the resistive state of the magnetoresistive element MTJ is thus read.

Vref and Vcheck are potentials to be applied in the read circuit 26 in the read/hard error check operation. For example, in the read operation, the multiplexer 29 selects Vref based on select signal SEL1, and in the hard error check operation, the multiplexer 29 selects Vcheck based on select signal SEL1.

For example, as shown in FIG. 7, Vref and Vcheck are potentials to be applied to a control terminal (gate) of a clamp transistor (FET) Trc on a reference cell REF side in the read circuit 26. Furthermore, for example, as shown in FIG. 7, Vclamp is a potential to be applied to a control terminal (gate) of a clamp transistor (FET) Tmc on a memory cell MC side in the read circuit 26.

It should be noted that FIG. 7 shows an equivalent circuit at the time of executing the read/hard error check operation in the magnetic memory as shown in FIG. 3, and elements identical to those in FIG. 3 are denoted by the same signs as in FIG. 3.

Also, the reference cell REF is an element which has a resistance value between the resistance value of the magnetoresistive element MTJ in a memory cell MC, which is in the parallel state, and the resistance value of the magnetoresistive element MTJ in the memory cell MC, which is in the antiparallel state. For example, it is an element having a resistance value which is at the center of the range between the resistance value of the magnetoresistive element MTJ being in the parallel state and that of the magnetoresistive element MTJ being in the antiparallel state. The reference cell REF may be a magnetoresistive element or a resistive element.

For example, as shown in FIG. 7, in the read/hard error check operation, in the case where Vclamp is applied to the control terminal of the clamp transistor Tmc, if the magnetoresistive element MTJ is in the parallel state (resistance: smaller), current Imc flowing in the bit line BL is Ip. Furthermore, in this case, if the magnetoresistive element MTJ is in the antiparallel state (resistance: larger), current Imc flowing in the bit line BL is Iap. It should be noted that Ip>Iap.

Therefore, for example, in the read operation, when Vref is applied to the control terminal of the clamp transistor Trc, if current Irc flowing in a reference line RL is Iref, a sense amplifier SA compares current Imc (=Ip or Iap) flowing in the bit line BL and current Irc (=Iref) flowing in the reference line RL with each other, thereby enabling the resistive state (data 0 or 1) of the magnetoresistive element MTJ to be read.

Figures 8, 11:
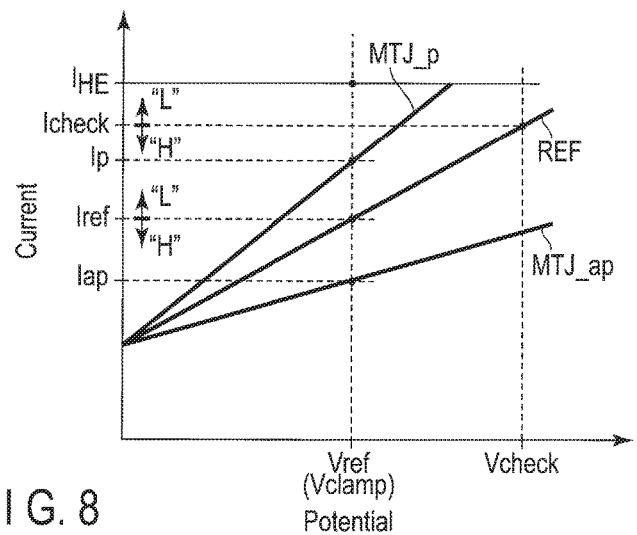
FIG. 8 is a view showing relationships between Vref, Vclamp and Vcheck, and between Iap, Iref, Ip, Icheck and $I_{HE}$.
FIG. 11 is a view showing a relationship between the state and resistance value of a magnetoresistive element.

However, as shown in FIG. 8, Iap<Iref<Ip. Furthermore, Vref may be equal to Vclamp. In FIG. 8, MTJ_p denotes the magnetoresistive element being in the parallel state, MTJ_ap denotes the magnetoresistive element being in the antiparallel state, and REF denotes the reference cell.

To be more specific, if current Imc flowing in the bit line BL is Iap, Iap<Iref. Thus, the sense amplifier SA outputs "H (high)" representing read data 1 as output signal Dout. If current Imc flowing in the bit line BL is Ip, Iref<Ip. Thus, the sense amplifier SA outputs "L (low)" representing read data 0 as output signal Dout.

In the read operation, for example, a demultiplexer 30 in the read circuit 26 transfers output signal (read data) Dout to the interface unit based on a control signal CNT.

On the other hand, for example, in the hard error check operation, if Vcheck (>Vref) is applied to the control terminal of the clamp transistor Trc, and current Irc which flows in the reference line RL is set to Icheck, the sense amplifier SA can read the resistive state (presence/absence of an error) of the magnetoresistive element MTJ by comparing current Imc (=Ip or Iap or $I_{HE}$) flowing in the bit line BL and current Irc (=Icheck) flowing in the reference line RL with each other.

In this case, as shown in FIG. 8, Iref<Icheck, and Iap<Ip<Icheck<$I_{HE}$. $I_{HE}$ is a current which flows in the bit line BL in the case where in the hard error check operation, the memory cell is a hard-error cell, i.e., the magnetoresistive element MTJ has a hard error.

That is, if current Imc flowing in the bit line BL is Ip or Iap, Iap<Icheck, or Ip<Icheck. Thus, the sense amplifier SA outputs, as an output signal Dout, "H" indicating that a hard error is absent. Furthermore, current Imc flowing in the bit line BL is $I_{HE}$, Icheck<$I_{HE}$. Thus, the sense amplifier SA outputs, as an output signal Dout, "L" indicating that a hard error is present.

In the hard error check operation, for example, the demultiplexer 30 in the read circuit 26 transfers the output signal (read data) Dout to a read/write/hard-error controller based on the control signal CNT.

Figure 9:
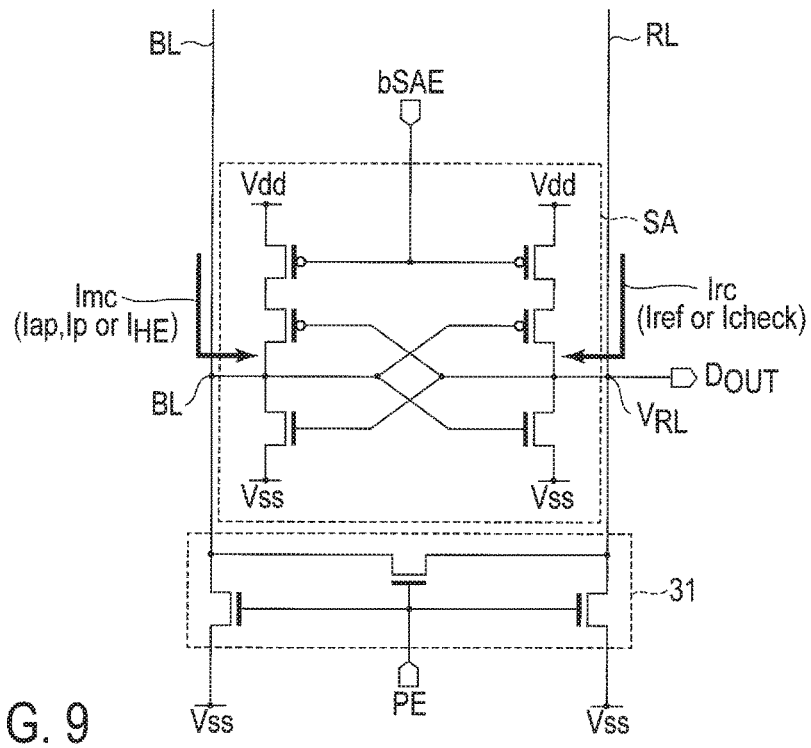
FIG. 9 is a view showing a first example of a sense amplifier.

FIG. 9 shows the first example of the sense amplifier.

The sense amplifier SA is a voltage sense type.

When the control signal bSAE becomes "L", the sense amplifier SA enters an active state. In the embodiment, even before the sense amplifier SA enters the active state, it can evaluate potential VBL of the bit line BL and potential VRL of the reference line RL using an N-channel transistor in the sense amplifier SA.

When the sense amplifier SA enters the active state, a latch circuit made up of the P-channel transistor and N-channel transistor in the sense amplifier SA senses and latches data of a memory cell. For example, when Imc (=Iap)<Irc (=Iref), and Imc (=Iap or Ip)<Irc (=Icheck), output signal Dout of the sense amplifier SA becomes "H". Also, when Irc (=Iref)<Imc (=Ip), and Irc (=Icheck)<Imc (=$I_{HE}$), output signal Dout of the sense amplifier SA becomes "L".

A precharge/equalize circuit 31 resets potential VBL of the bit line BL and potential VRL of the reference line RL, before the sense amplifier SA executes sensing and latching. When a control signal PE is "H", the bit line BL and the reference line RL are set at, for example, ground potential Vss.

Figure 10:
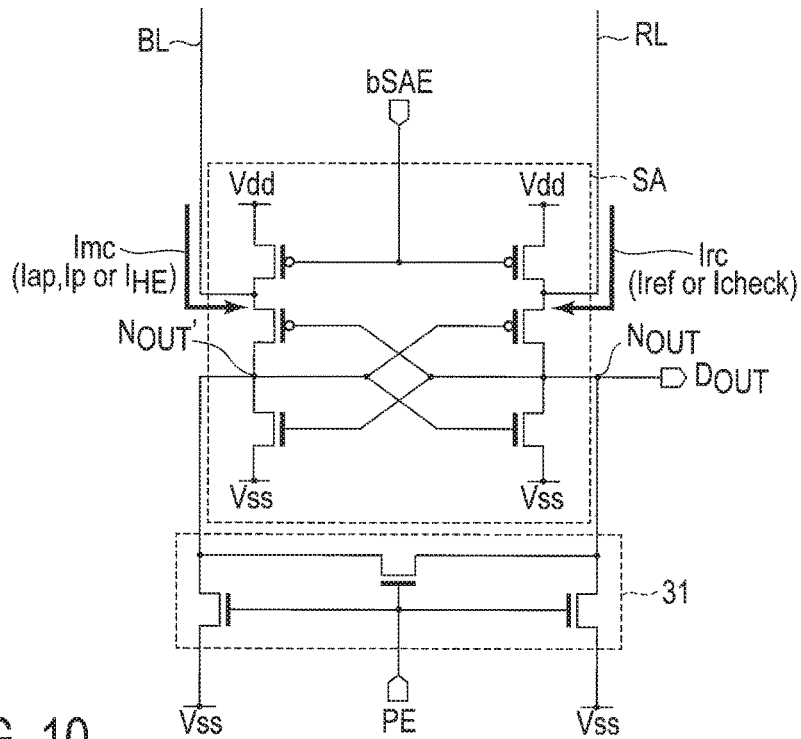
FIG. 10 is a view showing a second example of the sense amplifier.

FIG. 10 shows the second example of the sense amplifier.

The sense amplifier SA is of a current sense type.

When the control signal bSAE becomes "L", the sense amplifier SA enters an active state.

When the sense amplifier SA enters the active state, a latch circuit made up of the P-channel transistor and N-channel transistor in the sense amplifier SA senses and latches data of a memory cell. For example, when Imc (=Iap)<Irc (=Iref), and Imc (=Iap or Ip)<Irc (=Icheck), output signal Dout of the sense amplifier SA becomes "H". Also, when Irc (=Iref)<Imc (=Ip), and Irc (=Icheck)<Imc (=$I_{HE}$), output signal Dout of the sense amplifier SA becomes "L".

The precharge/equalize circuit 31 resets the potentials of nodes $N_{OUT}$ and $N_{OUT'}$ before execution of sensing and latching by the sense amplifier SA. When the control signal PE is "H", nodes $N_{OUT}$ and $N_{OUT'}$ are set at, for example, ground potential Vss.

Next, it will be explained why current Imc (=Ip or Iap) flowing in a normal cell, current Imc (=$I_{HE}$) flowing in a hard-error cell and current Irc (=Iref or Icheck) flowing in a reference cell have such a relationship shown in FIG. 8.

FIG. 11 shows a relationship between the state and resistance value of a magnetoresistive element.

The magnetoresistive element MTJ comprises as its basic structure, for example, a storage layer (magnetic layer) SL, a reference layer (magnetic layer) RL and a nonmagnetic layer (tunnel barrier layer) TN between those layers. When the magnetoresistive element MTJ is in the antiparallel state, resistance value Rap thereof is generally high. When the magnetoresistive element MTJ is in the parallel state, reference value Rp thereof is generally low.

It is known that the nonmagnetic layer TN in the magnetoresistive element MTJ deteriorates with age; that is, its film quality gradually lowers as the number of writes increases. For example, as the number of writes increases, the number of lattice defects in the nonmagnetic layer TN and the amount of charge trapped thereby increase, and finally the nonmagnetic layer (insulating layer) TN causes dielectric breakdown. If the nonmagnetic layer TN causes dielectric breakdown, resistance value $R_{HE}$ of the magnetoresistive element MTJ decreases to be extremely low, with respect to Rp.

Therefore, the resistances of the magnetoresistive element MTJ in the above three states are such that $R_{HE}$<Rp<Rap.

This, as is clear from FIGS. 7 and 8, means that in the case where the state of the magnetoresistive element MTJ is detected using Vclamp and Vref, when the magnetoresistive element MTJ is in the hard-error state, $I_{HE}$ flows in the bit line BL; when the magnetoresistive element MTJ is in the parallel state, Ip flows in the bit line BL; and when the magnetoresistive element MTJ is in the antiparallel state, Iap flows in the bit line BL. Iap, Ip and $I_{HE}$ are such that Iap<Ip<$I_{HE}$.

Figure 12:
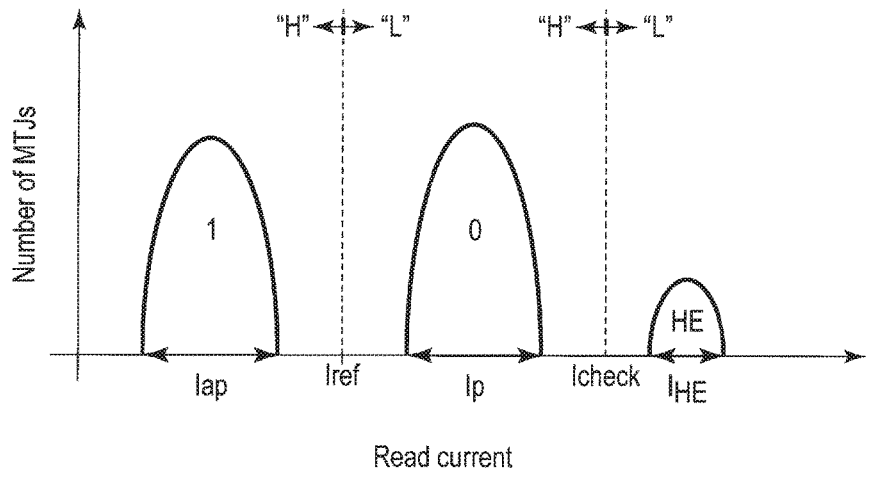
FIG. 12 is a view showing a relationship between read current (Iap, Ip and $I_{HE}$) and reference current (Iref and Icheck).

Iap, Ip and $I_{HE}$ have distributions, for example, as shown in FIG. 12, because of the variance between the characteristics of memory cells, etc. However, the distributions are separated from each other by a given margin. Therefore, for example, in the read operation, if reference current Iref for discriminating between Iap (data 1) and Ip (data 0) is produced, the sense amplifier can determine data of a memory cell using reference current Iref.

Furthermore, for example in the hard error check operation, if reference current Icheck for discriminating between Iap/Ip (data 1/0) and $I_{HE}$ (hard error HE) is produced, it is possible to determine using reference current Icheck whether the memory cell is in the hard-error state or not.

It should be noted that Iref and Icheck are such that Iref<Icheck. In order that this relationship be established, for example, as is clear from FIGS. 7 and 8, it suffices that the potential of the control terminal of a clamp transistor on the reference line RL side is set to Vref in order to produce Iref, and is set to Vcheck in order to produce Icheck. In this case, the reference value of reference cell REF is constant, and Vref<Vcheck.

According to the above embodiment, the memory system is made capable of checking the number of hard error cells in the magnetic memory, the positions of the hard error cells, etc., whereby for example, before the magnetic memory becomes defective, it can be replaced with a new magnetic memory (component replacement); and data in the magnetic memory can be transferred to another storage memory (data save), etc.

Figure 13:
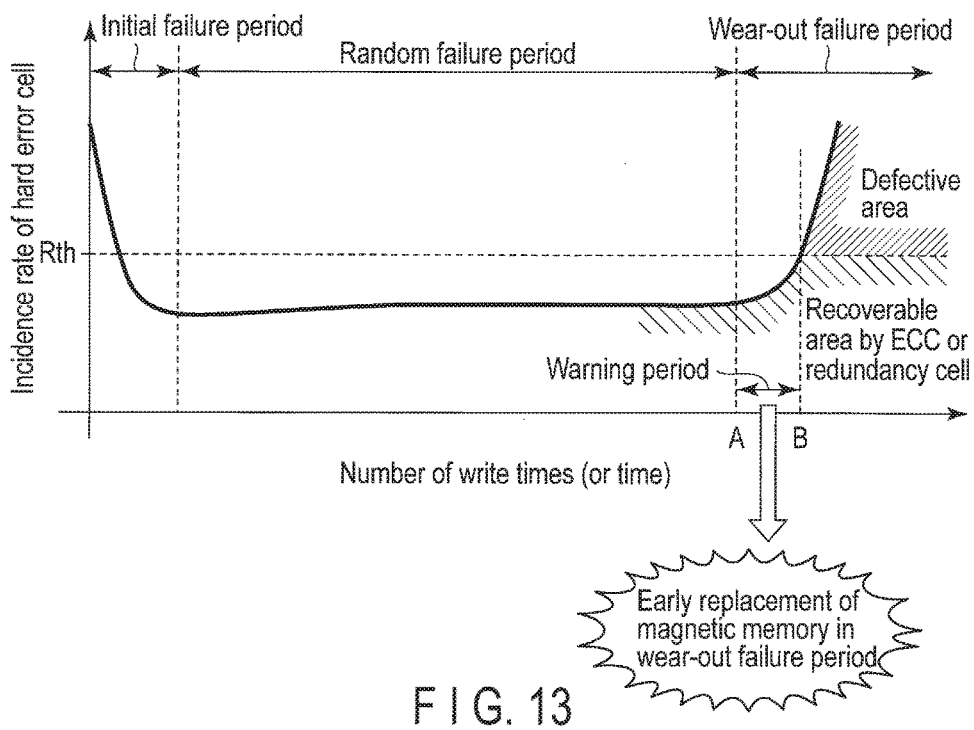
FIG. 13 is a view showing a change of an incidence rate of hard errors because of deterioration with age.

For example, as shown in FIG. 13, the incidence rate of hard error cells in the magnetic memory is high in an initial failure period and a wear-out failure period, and is low in a random failure period.

In the embodiment, mainly in the wear-out failure period, it is possible to detect a warning period before the incidence rate of hard error cells exceeds threshold value Rth, i.e., before the magnetic memory becomes defective. Whether the magnetic memory enters the warning period (A to B) or not can be easily ascertained by detecting a change of the incidence rate of hard error cells periodically or in response to an instruction given by a host (user).

In the case where the magnetic memory is in the warning period, the memory system notifies the user of this fact. Thus, before the magnetic memory becomes defective, the user takes the above countermeasure such as component replacement or data save.

(Applications)

Applications of the memory system according to the above embodiment will be explained.

FIGS. 14 to 19 show a first application.

In the first application, at a hard error check time, the host 10 checks information on hard error cells, such as the number of hard error cells and the positions thereof, based on data DATA read from the magnetic memory 13, and manages the state of the magnetic memory 13. In the above figures, elements corresponding to those in the above embodiment (FIGS. 1 to 13) are denoted by the same reference signs as in the embodiment, and their detailed explanations will be omitted.

Figure 16:
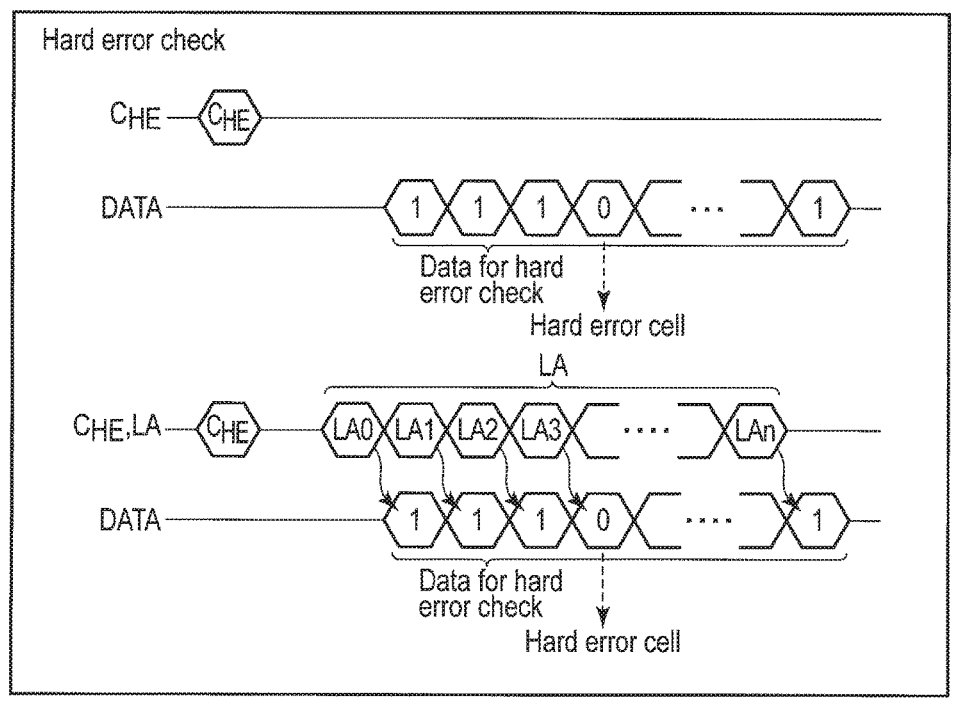

For example, in the case shown in FIGS. 14 to 16, when hard error check command $C_{HE}$ is transferred from the host 10 to the memory device 11, the controller 12 transfers hard error check command $C_{HE}$ to the magnetic memory 13. Upon reception of hard error check command $C_{HE}$, the magnetic memory 13 executes the hard error check operation on, for example, all a plurality of memory cells in the magnetic memory 13.

Data DATA read in the hard error check operation is successively transferred from the magnetic memory 13 to the host 10 through the controller 12. The host 10 checks information on hard error cells, such as the number of hard error cells and the positions thereof, based on data DATA read from the magnetic memory 13, and manages the state of the magnetic memory 13. When the hard error check operation ends, reply $R_{HE}$ indicating the ending of the hard error check operation is transferred from the magnetic memory 13 to the host 10 through the controller 12.

It should be noted that the host 10 can designate an area to be subjected to the hard error check operation. In this case, the host 10 transfers error-check command $C_{HE}$ and a logical address LA specifying an area to be subjected to the hard error check operation to the memory device 11. The controller 12 converts, for example, logical addresses LA (LA0, LA1, LA2, LA3, . . . LAn) into physical addresses PA, and transfers hard error check command $C_{HE}$ and the physical addresses PA to the magnetic memory 13.

Figure 17:
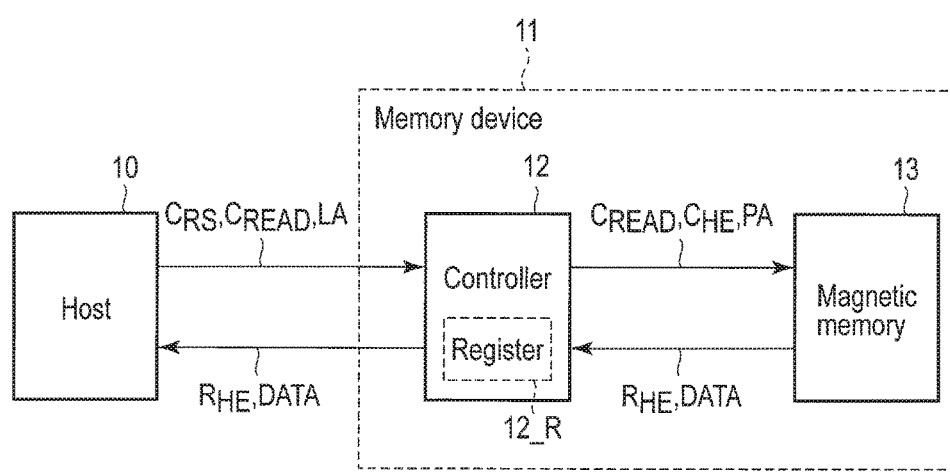
Figure 19:
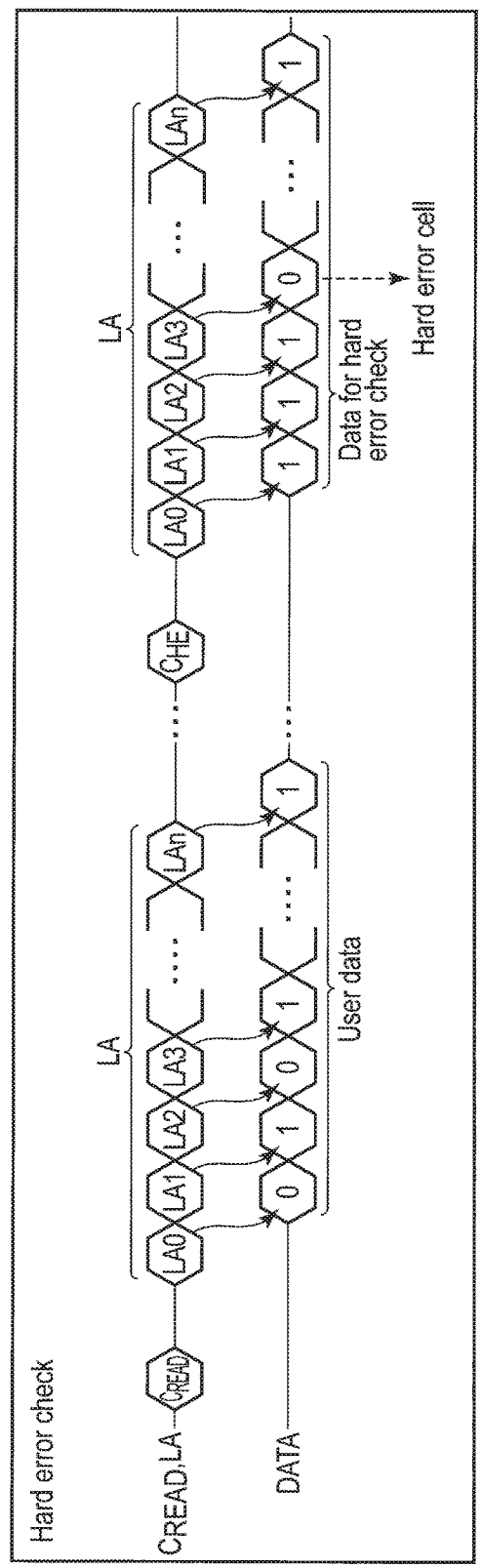

Furthermore, for example, in the case shown in FIGS. 17 to 19, when register set command $C_{RS}$ is transferred from the host 10 to the memory device 11, the controller 12 causes register 12_R which determines whether to execute the hard error check operation or not, to enter a set state (for example, 1). When register 12_R is in the set state, the hard error check operation is executed at predetermined timing, for example, at the time of turning the power on, at the time of turning the power off, or immediately after the read operation.

If register 12_R enters a reset state (for example, 0) immediately after turning the power on, and then enters the set state in response to register set command $C_{RS}$, its set state is maintained until the power is turned off. In addition, when register set command $C_{RS}$ is not transferred from the host 10 to the memory device 11, register 12_R is kept at the reset state, and the hard error check operation is not executed.

The following explanation is given with respect to the case where when register 12_R is in the set state, the hard error check operation is continuously executed immediately after the read operation.

When register set command $C_{RS}$ is transferred from the host 10 to the memory device 11, the controller 12 causes register 12_R to enter the set state.

Then, when read command $C_{READ}$ and logical addresses LA (LA0, LA1, LA2, LA3, . . . , LAn) are transferred from the host 10 to the memory device 11, the controller 12 converts the logical addresses LA into physical addresses PA, and transfers read command $C_{read}$ and the physical addresses PA to the magnetic memory 13. Upon reception of read command $C_{READ}$, the magnetic memory 13 executes the read operation on, for example, a plurality of memory cells in the magnetic memory 13, which correspond to the physical addresses PA.

Data DATA read in the read operation is successively transferred from the magnetic memory 13 to the host 10 through the controller 12. When the read operation ends, reply $R_{READ}$ indicating the ending of the read operation is transferred from the magnetic memory 13 to the host 10 through the controller 12.

Also, when the read operation ends, the controller 12 transfers hard error check command $C_{HE}$ and the physical addresses PA related to the above read operation to the magnetic memory 13. Upon reception of hard error check command $C_{HE}$, the magnetic memory 13 executes the hard error check operation on, for example, all a plurality of memory cells in the magnetic memory 13, which correspond to the physical addresses PA.

Data DATA read in the hard error check operation is successively transferred from the magnetic memory 13 to the host 10 through the controller 12. The host 10 checks information on hard error cells such as the number of hard error cells and the positions thereof based on data DATA read from the magnetic memory 13, and manages the state of the magnetic memory 13. When the hard error check operation ends, reply $R_{HE}$ indicating the ending of the hard error check operation is transferred from the magnetic memory 13 to the host 10 through the controller 12.

FIGS. 20 to 25 show a second application.

In the second application, at the hard error check time, the controller 12 in the memory device 11 checks information on hard error cells such as the number of hard error cells and the positions thereof based on data DATA read from the magnetic memory 13, and manages the state of the magnetic memory 13. In the above figures, elements corresponding to those in the above embodiment (FIGS. 1 to 13) are denoted by the same reference signs as in the above embodiment, and their detailed explanations will be omitted.

Figure 22:
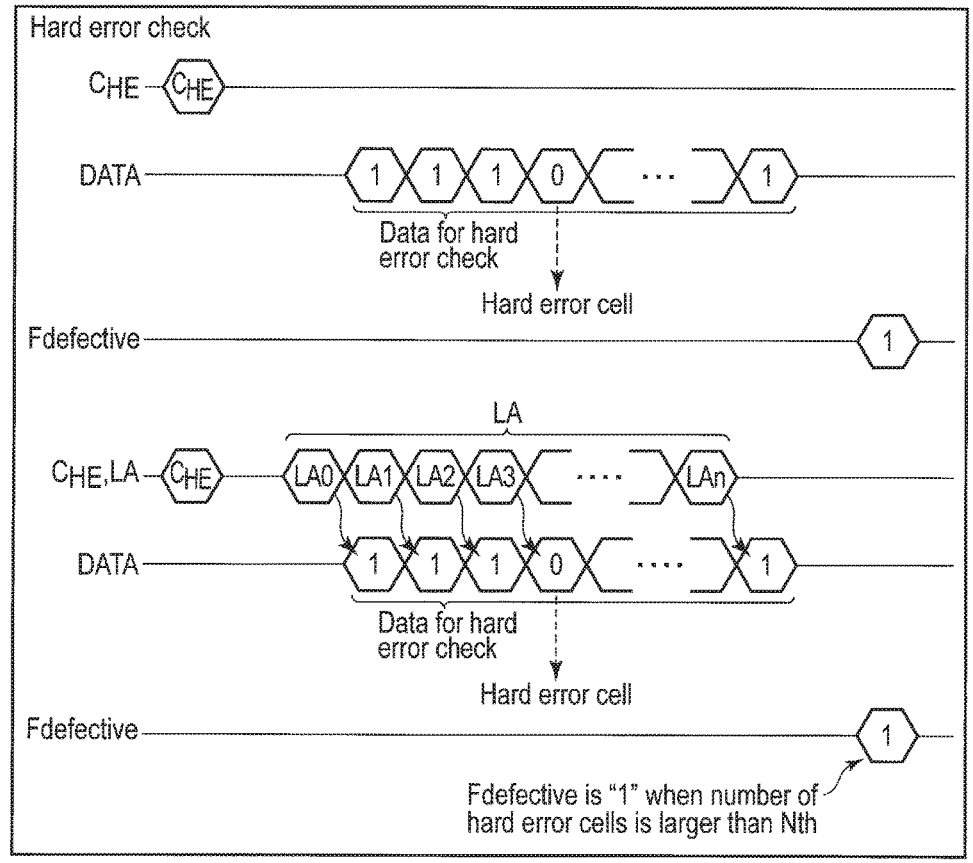

For example, in the case shown in FIGS. 20 to 22, when hard error check command $C_{HE}$ is transferred from the host 10 to the memory device 11, the controller 12 transfers hard error check command $C_{HE}$ to the magnetic memory 13. Upon reception of hard error check command $C_{HE}$, the magnetic memory 13 executes the hard error check operation on, for example, all a plurality of memory cells in the magnetic memory 13.

Data DATA read in the hard error check operation is successively transferred from the magnetic memory 13 to the controller 12. The controller 12 checks information on hard error cells such as the number of hard error cells and the positions thereof based on data DATA read from the magnetic memory 13, and manages the state of the magnetic memory 13.

For example, when the number of hard error cells exceeds threshold value Nth, the controller 12 transfers flag information (e.g., Fdefective=1) indicating that the magnetic memory 13 has become defective to the host 10. Instead of doing so, the controller 12 may manage two threshold values Nth0 and Nth1. In this case, for example, when the number of hard error cells exceeds threshold value Nth0, the controller 12 transfers flag information (e.g., Fdefective=01) indicating that the magnetic memory 13 has entered the warning period as shown in FIG. 13 to the host 10, and when the number of hard error cells exceeds threshold value Nth1, the controller 12 transfers flag information (e.g., Fdefective=10) indicating that the magnetic memory 13 has become defective to the host 10.

When the hard error check operation ends, reply $R_{HE}$ indicating the ending of the hard error check operation is transferred from the magnetic memory 13 to the host 10 through the controller 12.

It should be noted that the host 10 can designate an area to be subjected to the hard error check operation as in the first application. In this case, the host 10 transfers error check command $C_{HE}$ and a logical address LA specifying the area to be subjected to the hard error check operation to the memory device 11. The controller 12 converts, for example, logical addresses LA (LA0, LA1, LA2, LA3, . . . LAn) into physical addresses PA, and transfers hard error check command $C_{HE}$ and the physical addresses PA to the magnetic memory 13.

Figure 23:
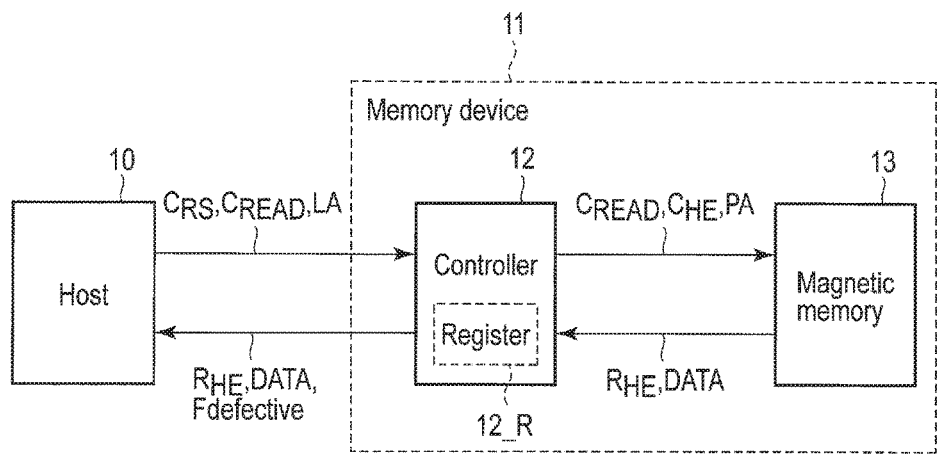
Figure 24:
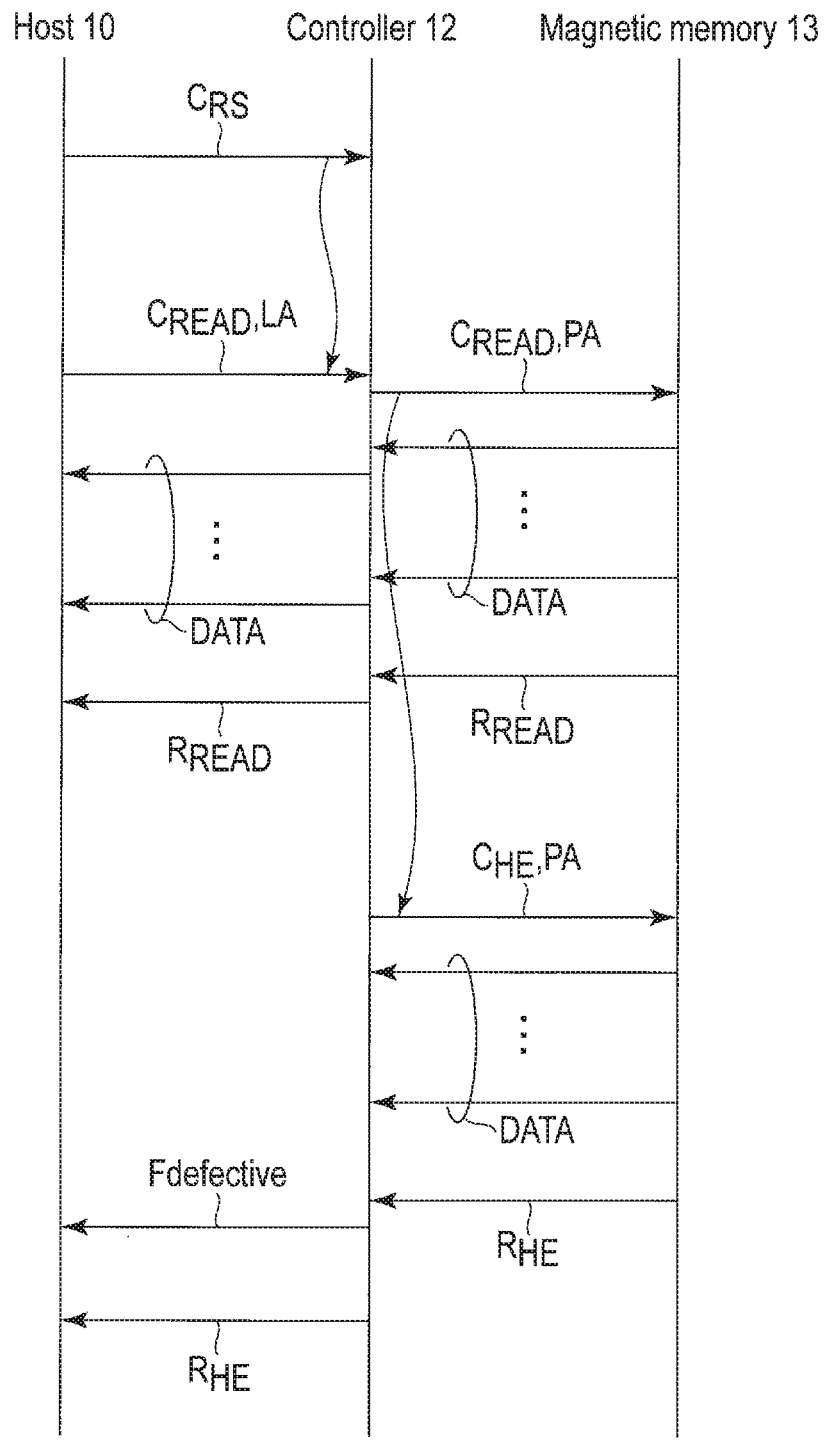

Furthermore, for example, in the case shown in FIGS. 23 to 25, when register set command $C_{RS}$ is transferred from the host 10 to the memory device 11, the controller 12 causes register 12_R to enter a set state (for example, 1). The relationship between the state of register 12_R and whether to execute the hard error check operation or not is explained above with respect to the first application, and its explanation will thus be omitted.

The following explanation is given with respect to the case where when register 12_R is in the set state, the hard error check operation is continuously executed immediately after the read operation, as in the first application.

When register set command $C_{RS}$ is transferred from the host 10 to the memory device 11, the controller 12 causes register 12_R to enter the set state.

Then, when read command $C_{READ}$ and logical addresses LA (LA0, LA1, LA2, LA3, . . . LAn) are transferred from the host 10 to the memory device 11, the controller 12 converts the logical addresses LA into physical addresses PA, and transfers read command $C_{READ}$ and the physical addresses PA to the magnetic memory 13. Upon reception of read command $C_{READ}$, the magnetic memory 13 executes the read operation on, for example, a plurality of memory cells in the magnetic memory 13, which correspond to the physical addresses PA.

Data DATA read in the read operation is successively transferred from the magnetic memory 13 to the host 10 through the controller 12. When the read operation ends, reply $R_{READ}$ indicating the ending of the read operation is transferred from the magnetic memory 13 to the host 10 through the controller 12.

Also, when the read operation ends, the controller 12 transfers hard error check command $C_{HE}$ and the physical addresses PA related to the above read operation to the magnetic memory 13. Upon reception of hard error check command $C_{HE}$, the magnetic memory 13 executes the hard error check operation on, for example, all a plurality of memory cells in the magnetic memory 13, which correspond to the physical addresses PA.

Data DATA read in the hard error check operation is successively transferred from the magnetic memory 13 to the controller 12. The controller 12 checks information on hard error cells, such as the number of hard error cells and the positions thereof, based on data DATA read from the magnetic memory 13, and manages the state of the magnetic memory 13.

For example, when the number of hard error cells exceeds threshold value Nth, the controller 12 transfers flag information (e.g., Fdefective=1) indicating that the magnetic memory 13 has become defective to the host 10, as in the case shown in FIGS. 20 to 22. Instead of doing so, the controller 12 may manage two threshold values Nth0 and Nth1 as in the case shown in FIGS. 20 to 22. The case of managing two threshold values Nth0 and Nth1 is explained above with respect to the case shown in FIGS. 20 to 22, and its explanation will thus be omitted.

When the hard error check operation ends, reply $R_{HE}$ indicating the ending of the hard error check operation is transferred from the magnetic memory 13 to the host 10 through the controller 12.

FIGS. 26 to 31 show a third application.

In the third application, at the hard error check time, the magnetic memory 13 in the memory device 11 manages information on hard error cells such as the number of hard error cells and the positions thereof based on read data DATA. In the above figures, elements corresponding to those in the above embodiment (FIGS. 1 to 13) are denoted by the same reference signs as in the above embodiment, and their detailed explanations will be omitted.

Figure 26:
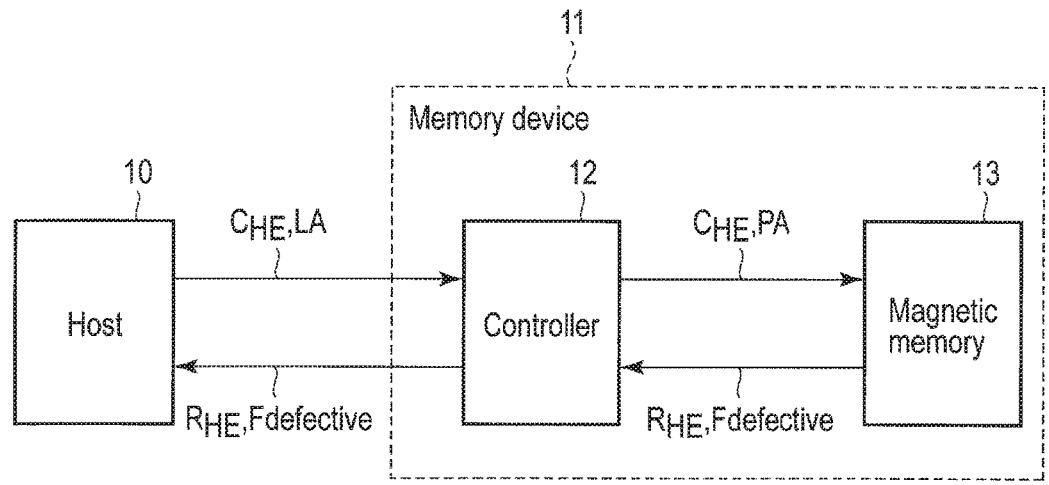
Figure 27:
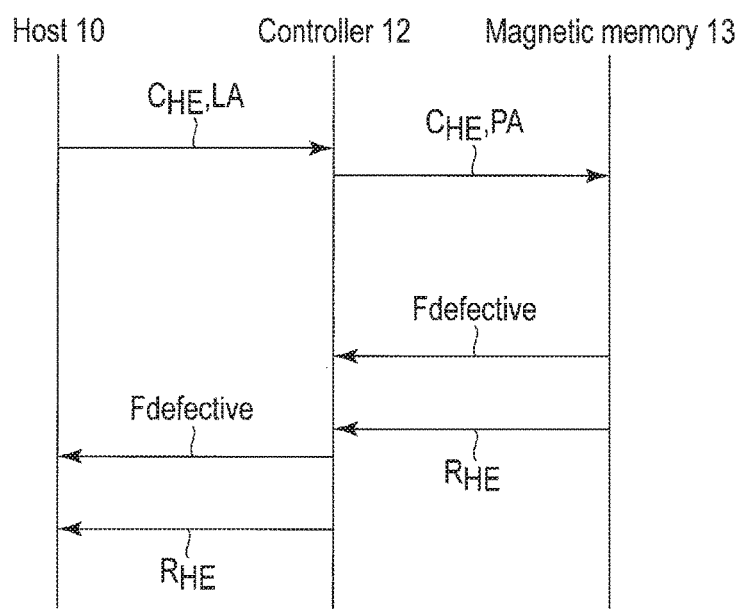
Figure 28:
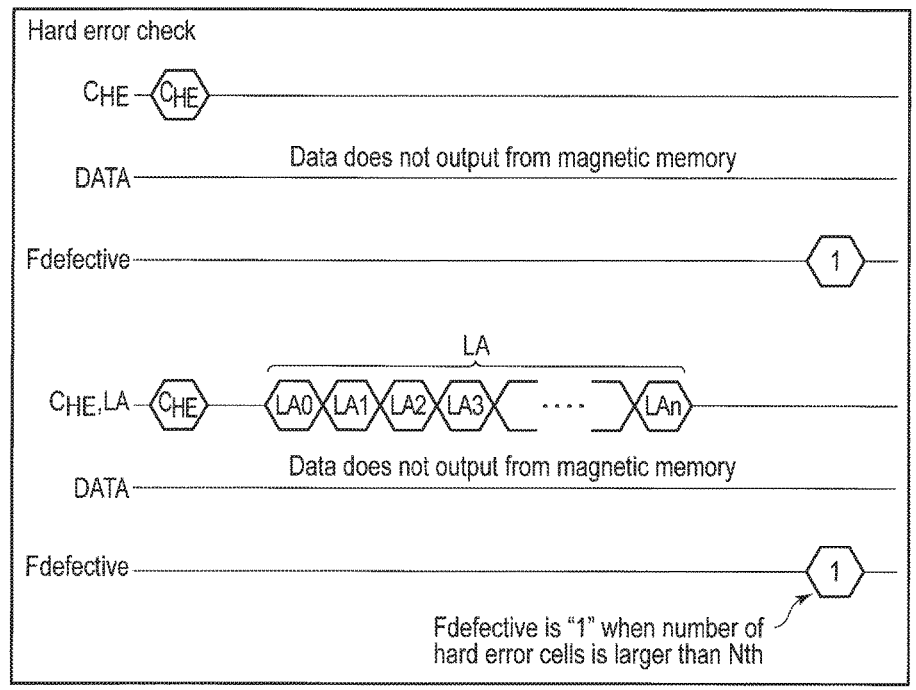

For example, in the case shown in FIGS. 26 to 28, when hard error check command $C_{HE}$ is transferred from the host 10 to the memory device 11, the controller 12 sends hard error check command $C_{HE}$ to the magnetic memory 13. Upon reception of hard error check command $C_{HE}$, the magnetic memory 13 executes the hard error check operation on, for example, all a plurality of memory cells in the magnetic memory 13.

Data DATA read in the hard error check operation is transferred to the read/write/hard error check controller 21 as shown in FIGS. 2 and 3 by, for example, the demultiplexer 30 as shown in FIG. 7, without being output to the outside of the magnetic memory 13. The read/write/hard error check controller 21 as shown in FIGS. 2 and 3 manages information on hard error cells, such as the number of hard error cells and the positions thereof, based on read data DATA.

For example, when the number of hard error cells exceeds threshold value Nth, the read/write/hard error check controller 21 as shown in FIGS. 2 and 3 outputs flag information (e.g., Fdefective=1) indicating that the magnetic memory 13 has become defective, as in the second application. The flag information is transferred to the host 10 through the controller 12. Instead of doing so, the read/write/hard error check controller 21 as shown in FIGS. 2 and 3 may manage two threshold values Nth0 and Nth1 as in the second application. The case of managing two threshold values Nth0 and Nth1 is explained above with respect to the second application, and its explanation will thus be omitted.

When the hard error check operation ends, reply $R_{HE}$ indicating the ending of the hard error check operation is transferred from the magnetic memory 13 to the host 10 through the controller 12.

It should be noted that the host 10 can designate an area to be subjected to the hard error check operation as in the first application. In this case, the host 10 transfers error check command $C_{HE}$ and a logical address LA specifying the area to be subjected to the hard error check operation to the memory device 11. The controller 12 converts, for example, logical addresses LA (LA0, LA1, LA2, LA3, . . . , LAn) into physical addresses PA, and transfers hard error check command $C_{HE}$ and the physical addresses PA to the magnetic memory 13.

Figure 29:
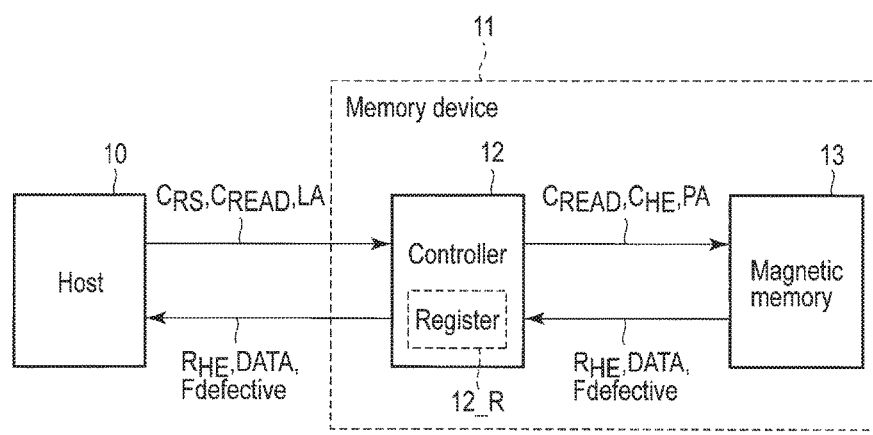
Figure 30:
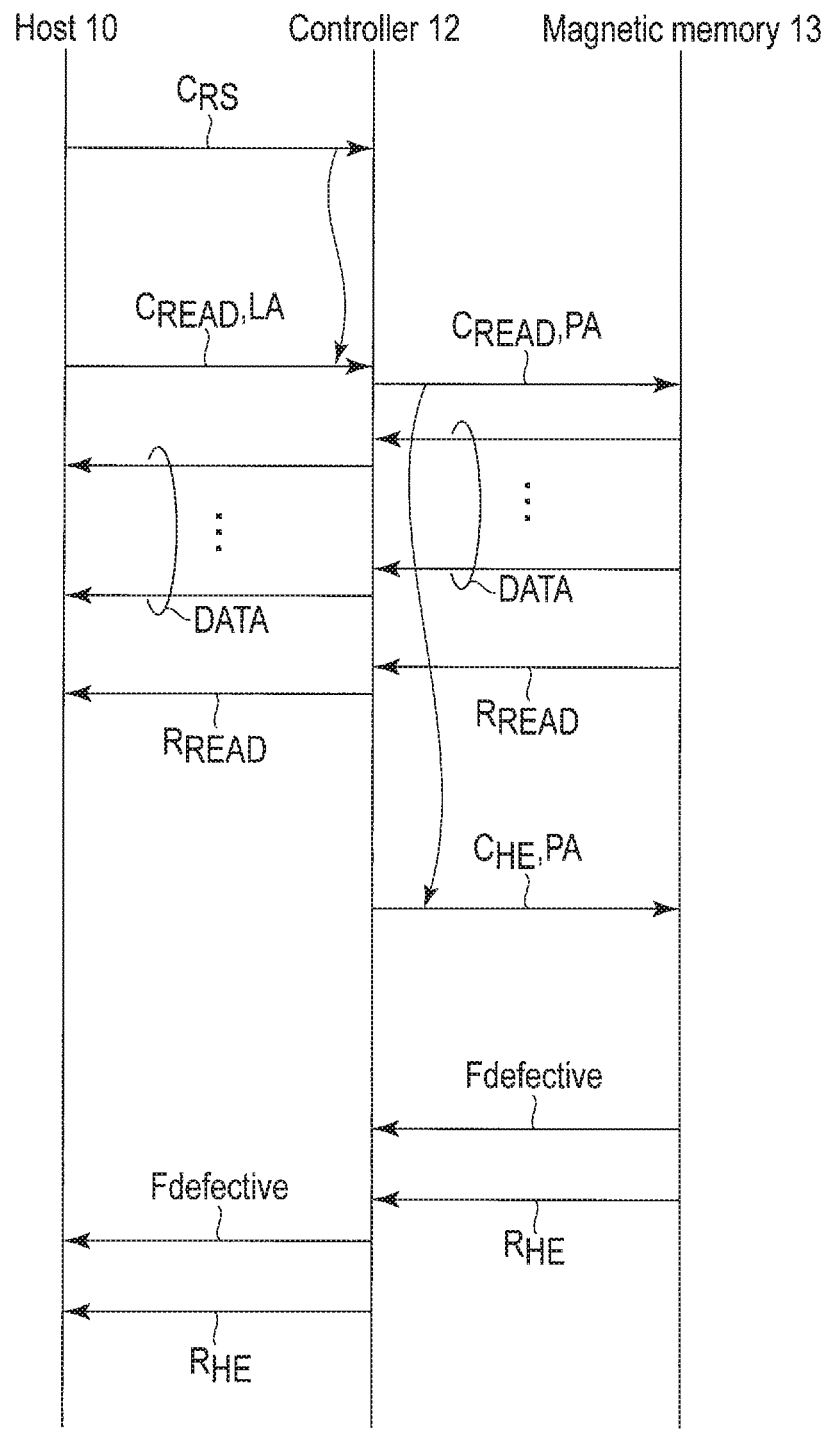

Furthermore, for example, in the case shown in FIGS. 29 to 31, when register set command $C_{RS}$ is transferred from the host 10 to the memory device 11, the controller 12 causes register 12_R to enter the set state (for example, 1). The relationship between the state of register 12_R and whether to execute the hard error check operation or not is explained above with respect to the first application, and its explanation will thus be omitted.

The following explanation is given with respect to the case where when register 12_R is in the set state, the hard error check operation is continuously executed immediately after the read operation, as in the first application.

When register set command $C_{RS}$ is transferred from the host 10 to the memory device 11, the controller 12 sets register 12_R at the set state.

Then, when read command $C_{READ}$ and logical addresses LA (LA0, LA1, LA2, LA3, . . . , LAn) are transferred from the host 10 to the memory device 11, the controller 12 converts the logical addresses LA into physical addresses PA, and transfers read command $C_{READ}$ and the physical addresses PA to the magnetic memory 13. Upon reception of read command $C_{READ}$, the magnetic memory 13 executes the read operation on, for example, a plurality of memory cells in the magnetic memory 13, which correspond to the physical addresses PA.

Data DATA read in the read operation is successively transferred from the magnetic memory 13 to the host 10 through the controller 12. When the read operation ends, reply $R_{READ}$ indicating the ending of the read operation is transferred from the magnetic memory 13 to the host 10 through the controller 12.

Also, when the read operation ends, the controller 12 transfers hard error check command $C_{HE}$ and the physical addresses PA related to the above read operation to the magnetic memory 13. Upon reception of hard error check command $C_{HE}$, the magnetic memory 13 executes the hard error check operation on, for example, all a plurality of memory cells in the magnetic memory 13, which correspond to the physical addresses PA.

Data DATA read in the hard error check operation is transferred to the read/write/hard error check controller 21 as shown in FIGS. 2 and 3 by, for example, the demultiplexer 30 as shown in FIG. 7, without being output to the outside of the magnetic memory 13. The read/write/hard error check controller 21 as shown in FIGS. 2 and 3 manages information on hard error cells, such as the number of hard error cells and the positions thereof, based on read data DATA.

For example, when the number of hard error cells exceeds threshold value Nth, the read/write/hard error check controller 21 as shown in FIGS. 2 and 3 outputs flag information (e.g., Fdefective=1) indicating that the magnetic memory 13 has become defective, as in the second application. The flag information is transferred to the host 10 through the controller 12. Instead of doing so, the read/write/hard error check controller 21 as shown in FIGS. 2 and 3 may manage two threshold values Nth0 and Nth1 as in the second application. The case of managing two threshold values Nth0 and Nth1 is explained above with respect to the second application, and its explanation will thus be omitted.

When the hard error check operation ends, reply $R_{HE}$ indicating the ending of the hard error check operation is transferred from the magnetic memory 13 to the host 10 through the controller 12.

Figures 32, 33:
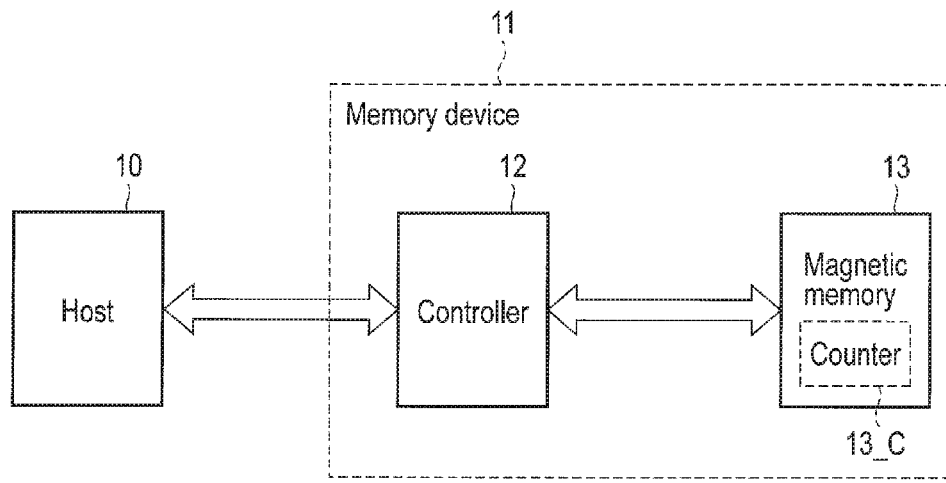

FIGS. 32 to 34 show a fourth application.

The fourth application is featured in that the magnetic memory includes a counter 13_C which registers the number of writes and that of hard error cells.

FIG. 32 shows a memory system according to the fourth application.

The memory system comprises the host 10 and the memory device 11. The memory device 11 comprises the controller 12 and the magnetic memory 13 which is controlled by the controller 12. The host 10, the memory device 11, the controller 12 and the magnetic memory 13 correspond to the host 10, the memory device 11, the controller 12 and the magnetic memory 13 in the memory system as shown in FIG. 1.

Also, the magnetic memory 13 comprises a counter 13_C. The counter 13_C, for example, as shown in FIG. 33, can register N_write times which is the number of writes and N_hard error cells which is the number of hard error cells. The value of the counter 13_C is updated each time the number of hard error cells related to the embodiment is checked. It is preferable that this checking be executed on a regular basis (e.g., at the time of turning the power on, at the time of turning the power off or predetermined timing between the time of turning the power on and that of turning the power off).

It is also preferable that the value of counter 13_C be stored in a nonvolatile memory. For example, the value of counter 13_C is stored in the magnetoresistive element in the magnetic memory 13.

In this case, for example, as shown in FIG. 34, the controller 12 can detect whether the magnetic memory 13 enters the wear-out period or not and whether the magnetic memory 13 is defective or not, based on the N_write times which is the number of writes and the N_hard error cells which is the number of hard error cells.

For example, when the magnetic memory 13 enters the wear-out period, as shown in FIG. 13, the incidence rate of hard error cells increases. Therefore, as shown in FIG. 34, for example, the controller 12 can confirm whether the magnetic memory 13 enters the wear-out period (starting from point A) or not, based on the number Nth0 of hard error cells or the rate of change thereof (dN_hard error cells/dN_write times).

However, the dN_hard error cells is a value obtained by subtracting the number of hard error cells detected by an N−Xth (X=1, 2, . . . ) check, from the number of hard error cells detected by an N-th (present) check, and the dN_write times is a value X obtained by subtracting N−X from N.

Also, the controller 12 can confirm whether the magnetic memory 13 is defective or not, based on the N_hard error cells which is the number of hard error cells. For example, where Nth1 is the number of error bits (the number of hard error cells) on which recovery/correction can be executed by redundancy replacement/the ECC, the controller 12 determines that the magnetic memory 13 is defective when the N_hard error cells which is the number of hard error cells is greater than Nth1 (it falls within a range starting from point B). At this time, the controller 12 is allowed to transfer information indicating that the magnetic memory 13 is defective to the host 10.

Furthermore, the controller 12 determines a period (A to B) from time (A) at which the magnetic memory 13 enters the wear-out period to time (B) at which the magnetic memory 13 becomes defective, as a warning period. Also, when the magnetic memory 13 is in the warning period, the controller 12 is allowed to transfer information indicating that the magnetic memory 13 is in the warning period to the host 10. When the magnetic memory 13 is in the warning period, the host 10 is allowed to make to the user a signal urging the user to replace the magnetic memory 13 or save data in the magnetic memory 13.

Figure 37:
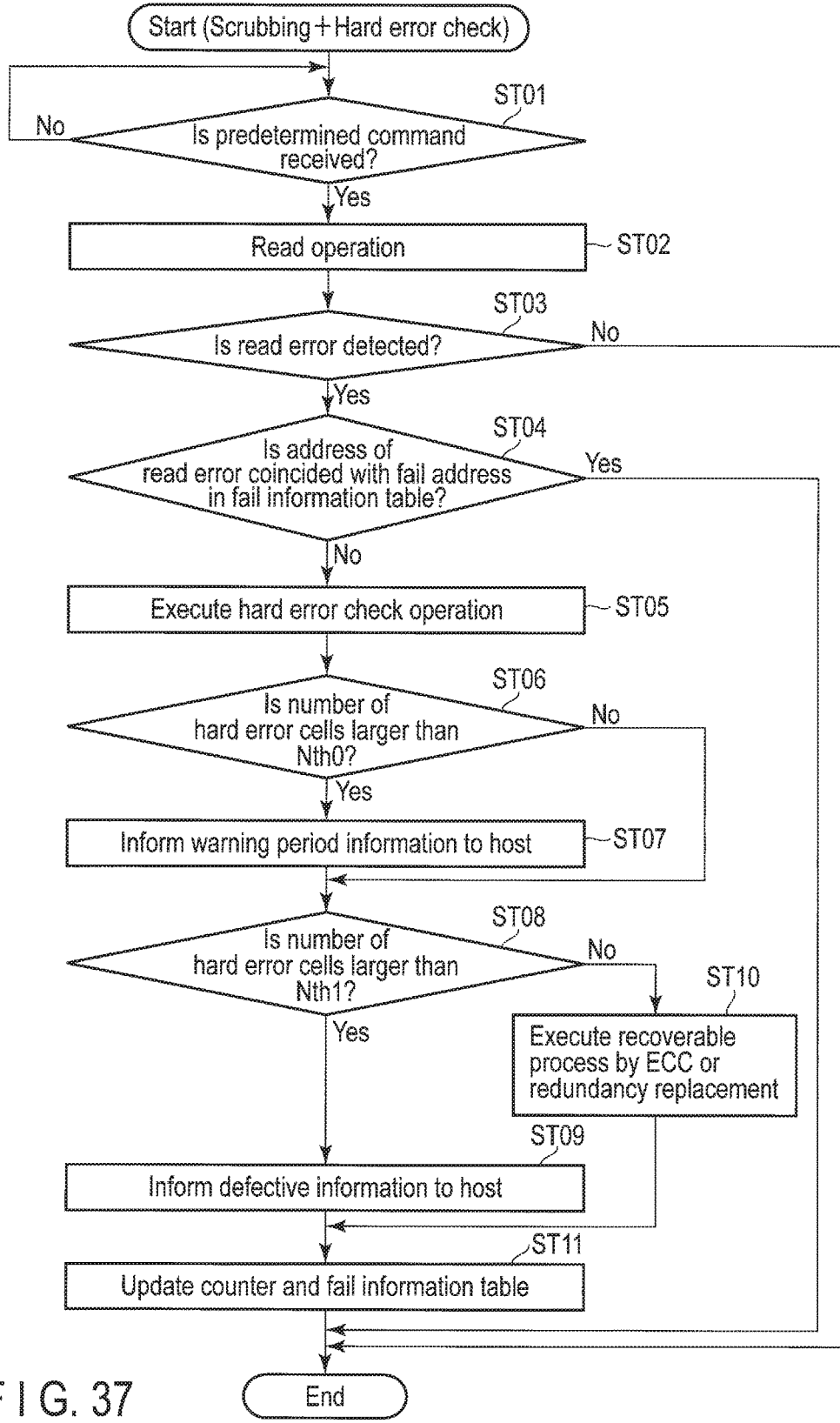

FIGS. 35 to 37 show a fifth application.

In the fifth application, a scrubbing function is added to the function of checking the number of hard error cells and the positions thereof in the embodiment. The scrubbing function is a function of checking the number of read-error cells and the positions thereof after manufacturing the memory device 11, and enabling a defective cell related to a read error or errors to be replaced with a redundancy cell when a predetermined condition is satisfied, i.e., a scrubbing function.

In the scrubbing function, it is set by, for example, the user that the number of defective cells, the positions thereof, etc. in the magnetic memory 13 in the memory device 11 can be periodically checked even after a memory system using the memory device 11 is provided, and if necessary, a defective cell can be replaced with a redundancy cell. Thus, the scrubbing function is a technique which effectively uses the redundancy function of the magnetic memory 13, and is effective to extend the life of the magnetic memory 13.

However, the scrubbing function is a function of specifying a defective cell having a read error occurring therein; that is, it cannot specify whether the error is caused by a soft error or a hard error; i.e., it cannot specify the cause (category) of the error. Thus, for example, if the number of errors is greater than a predetermined number (e.g., the number of errors which can be corrected by the ECC), the defective cell is replaced with a redundancy cell regardless of the cause of an error.

If the cause of an error could be specified by the scrubbing function, of plurality of defective cells, a hard-error cell or cells could be preferentially replaced by redundancy cells, whereby the life of the magnetic memory 13 could be further extended. This life extension is achieved by the function of enabling the number of hard error cells, the positions thereof, etc., to be checked in the embodiment.

FIG. 35 shows a memory system according to the fifth application.

The memory system comprises the host 10 and the memory device 11. The memory device 11 comprises the controller 12 and the magnetic memory 13 which is controlled by the controller 12. The host 10, the memory device 11, the controller 12 and the magnetic memory 13 correspond to the host 10, the memory device 11, the controller 12 and the magnetic memory 13 in the memory system as shown in FIG. 1.

Also, the magnetic memory 13 comprises a counter 13_C and a file information table 13_T.

The counter 13_C, for example, as shown in FIG. 36, can register N_write times which is the number of writes, N_read error cells which is the number of read-error cells and N_hard error cells which is the number of hard error cells. The file information table 13_T, for example, as shown in FIG. 36, can register the position of a fail cell, i.e., a fail address (logical address LA and physical address PA), and the category of an error (whether it is a hard-error cell or not).

It should be noted that the fail cell is a cell in which a read error occurs, and covers a hard-error cell and a soft-error cell. The fail address is address information indicating the position of the fail cell.

The value of the counter 13_C and the contents of the file information table 13_T are updated each time scrubbing (including the hard error check operation related to the embodiment) is executed. It is preferable that the scrubbing be executed on a regular basis (e.g., at the time of turning the power on, at the time of turning the power off or at a predetermined timing between turning the power on and off).

Also, it is preferable that the value of the counter 13_C and the contents of the file information table 13_T be stored in the non-volatile memory. For example, the value of the counter 13_C and the contents of the file information table 13_T are stored in magnetoresistive elements in the magnetic memory 13.

FIG. 37 shows an example of the scrubbing operation according to the fifth application.

First, upon reception of a predetermined command from the host 10, the controller 12 instructs the magnetic memory 13 to execute the read operation (steps ST01 to ST02). The controller 12 detects whether a read error is present or absent based on data read from the magnetic memory 13 (step ST03).

The controller 12 confirms whether the address of a memory cell related to the read error is the same as a fail address stored in the file information table 13_T or not, and further executes the hard error check operation if the address is not the same as the fail address (steps ST04 to ST05).

The hard error check operation is an operation for checking, with respect to a memory cell whose read error is detected in step ST03, whether the error is caused by a hard error or not. To be more specific, the controller 12 accesses the memory cell (physical address PA) whose read error is detected, and executes the hard error check operation related to the embodiment.

Then, the controller 12 confirms, for example the number of read-error cells and that of hard error cells of the read-error cells based on the file information table 13_T and error information detected in step ST03.

The controller 12 informs the host 10 that the magnetic memory 13 has entered the warning period, for example, when the number of hard error cells is greater than Nth0 (see FIG. 34) (steps ST06 to ST07). Also, the controller 12 informs the host 10 that the magnetic memory 13 is defective, when the number of hard error cells is greater than Nth1 (see FIG. 34) (steps ST08 to ST09).

Furthermore, when the number of hard error cells is less than or equal to Nth1, the controller 12 determines whether to correct the read error with the ECC or execute redundancy replacement.

For example, when the number of read-error cells is less than or equal to the number of error bits correctable by the ECC, the controller 12 selects error correction with the ECC without executing redundancy replacement in which a defective cell or cells are replaced with redundancy cells. On the other hand, when the number of read-error cells is greater than the number of error bits correctable by the ECC, the controller 12 selects redundancy replacement in which a defective cell or cells (hard error cells) are replaced with redundancy cells (step ST10).

Thereafter, the controller 12 updates the counter 13_C and the file information table 13_T (step ST11). For example, when redundancy replacement is not executed, the N_write times, N_read error cells and N_hard error cells in the counter 13_C are updated, and new file address information (LA, PA and category of error) is added to the file information table 13_T.

Furthermore, when error recovery is executed by redundancy replacement, the N_write times, N_read error cells and N_hard error cells in the counter 13_C are updated, and the file address information (LA, PA and Category of error) on the memory cell subjected to the redundancy replacement is deleted from file information table 13_T.

When the above steps are carried out, the scrubbing operation according to the fifth application ends.

FIGS. 38 and 39 show a sixth application.

The sixth application is featured in that the magnetic memory 13 includes a plurality of areas (nine areas in the sixth application, i.e., areas A, B, C, D, E, F, G, H and I), and the hard error check operation according to the embodiment can be executed in units of one area.

FIG. 38 shows a memory system according to the sixth application.

The memory system comprises the host 10 and the memory device 11. The memory device 11 comprises the controller 12 and the magnetic memory 13 which is controlled by the controller 12. The host 10, the memory device 11, the controller 12 and the magnetic memory 13 correspond to the host 10, the memory device 11, the controller 12 and the magnetic memory 13 in the memory system as shown in FIG. 1.

Also, the magnetic memory 13 includes a plurality of areas A to I. The areas A to I, for example, may be provided in association with word lines WL or bit line pairs BL and bBL, respectively. Furthermore, the areas A to I may be independent memory cell arrays (e.g., Mat, Block and Memory core). Also, the areas A to I may be independent memory chips.

In this case, for example, as shown in FIG. 39, with respect to the areas A to I in the magnetic memory 13, the controller 12 can manage the N_write times which is the number of writes and the N_hard error cells which is the number of hard error cells.

In general, the incidence rate of hard error cells has a locality relativity in a memory chip, and a chip relativity in which the incidence rate varies from one memory chip to another.

Therefore, it is possible to reduce the incidence rate of hard errors and further extend the life of the magnetic memory 13, by dividing the magnetic memory 13 into the areas A to I, and managing the N_write times and the N_hard error cells with respect to each of the areas A to I, as in the sixth application.

For example, in the case where a hard-error cell or cells are managed in units of one magnetic memory 13 (it is not divided into a plurality of areas A to I), the write operation is executed even on an area (corresponding to, for example, area F) which enters the warning period (see FIG. 34). Inevitably, in the area which enters the warning period, a large number of hard error cells occur, and the life of the magnetic memory 13 is shortened.

On the other hand, in the case where the magnetic memory 13 is divided into a plurality of areas A to I, and a hard-error cell or cells are managed in units of one area, the write operation is not executed on an area (for example, area F) which enters the warning period, i.e., it can be executed concentratedly mainly on the other areas (for example, areas A to E and G to I).

It is therefore possible to restrict occurrence of hard error cells in the magnetic memory 13, and extend the life of the magnetic memory 13.

FIG. 40 shows a seventh application.

The seventh application relates to replacement of the magnetic memory 13.

As shown in FIG. 40, in the case where a plurality of magnetic memories (four magnetic memories in this application), i.e., magnetic memories 13-0, 13-1, 13-2 and 13-3, are connected to the controller 12, for example, if the magnetic memory 13-1, i.e., one of the magnetic memories, enters the warning period (see FIG. 34), the magnetic memory 13-1 can be replaced with a new magnetic memory 13-4 at an early stage, i.e., before the magnetic memory 13-1 becomes defective.

The magnetic memory 13-0, 13-1, 13-2, 13-3 may be memory chips or replaceable storage components.

CONCLUSION

As explained above, according to the above embodiment, the memory system is made capable of checking the number of hard error cells in the magnetic memory, the positions of the hard error cells, etc., whereby for example, before the magnetic memory becomes defective, it can be replaced with a new one; and data in the magnetic memory can be transferred to another storage memory.

It should be noted that although the embodiment is explained by referring to by way of example the magnetic memory as a memory, it can be applied to a memory which converts a resistance difference into a current difference or a voltage difference to execute sensing (read data).

That is, the embodiment can be applied to various kinds of memories having elements capable of reading data by comparing currents or voltages by referring to a resistance change, and memory devices having such memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory comprising:
a magnetoresistive element;
a reference cell;
a sense amplifier which compares a first current flowing in the magnetoresistive element with a second current flowing in the reference cell;
a first transistor having a first control terminal which controls a value of the first current;
a second transistor having a second control terminal which controls a value of the second current; and
a controller which applies a first potential to the first control terminal and a second potential to the second control terminal in a first operation for reading data from the magnetoresistive element, and which applies the first potential to the first control terminal and a third potential larger than the second potential to the second control terminal in a second operation for reading data from the magnetoresistive element.

2. The memory of claim 1, further comprising:
a potential selector which selects one of the second and third potentials based on a select signal from the controller.

3. A memory comprising:
a magnetoresistive element;
a reference cell;
a sense amplifier which compares first current flowing in the magnetoresistive element with a second current flowing in the reference cell;
a first transistor having a first control terminal which controls a value of the first current;
a second transistor having a second control terminal which controls a value of the second current; and
a controller which applies a first potential to the first control terminal and a second potential to the second control terminal in a first operation, and which applies the first potential to the first control terminal and a third potential larger than the second potential to the second control terminal in a second operation,
wherein the magnetoresistive element has one of a first resistance and a second resistance, and the reference cell has a resistance between the first and second resistances.

4. The memory of claim 3, wherein the reference cell has the resistance of a center of the first and second resistances.

5. The memory of claim 1, wherein a value of the second current is between a value of the first current when the magnetoresistive element has the first resistance and a value of the first current when the magnetoresistive element has the second resistance in the first operation.

6. The memory of claim 1, wherein the magnetoresistive element has a third resistance smaller than each of the first and second resistances in a defective state, and the second operation is an operation detecting the defective state.

7. The memory of claim 6, wherein a value of the second current is between a value of the first current when the magnetoresistive element has the first resistance or the second resistance and a value of the first current when the magnetoresistive element has the third resistance in the second operation.

8. The memory of claim 6, wherein the magnetoresistive element comprises a first magnetic layer, a second magnetic layer and an insulating layer between the first and second magnetic layers, and the defective state is a state in which the insulating layer has a dielectric breakdown.

9. The memory of claim 8, wherein the first and second magnetic layers have magnetization directions respectively in a direction in which the first and second magnetic layers are stacked.

10. The memory of claim 6, wherein the controller manages the magnetoresistive element with the defective state.

11. A memory comprising:
a variable resistance element;
a reference cell;
a sense amplifier which compares a first current flowing in the variable resistance element with a second current flowing in the reference cell;
a first transistor having a first control terminal which controls a value of the first current;
a second transistor having a second control terminal which controls a value of the second current; and
a controller which applies a first potential to the first control terminal and a second potential to the second control terminal in a first operation for reading from the variable resistance element, and which applies the first potential to the first control terminal and a third potential larger than the second potential to the second control terminal in a second operation for reading from the variable resistance element.

12. The memory of claim 3, wherein a value of the second current is between a value of the first current when the magnetoresistive element has the first resistance and a value of the first current when the magnetoresistive element has the second resistance in the first operation.

13. The memory of claim 3, wherein the magnetoresistive element has a third resistance smaller than each of the first and second resistances in a defective state, and the second operation is an operation detecting the defective state.

14. The memory of claim 13, wherein a value of the second current is between a value of the first current when the magnetoresistive element has the first resistance or the second resistance and a value of the first current when the magnetoresistive element has the third resistance in the second operation.

15. The memory of claim 13, wherein the magnetoresistive element comprises a first magnetic layer, a second magnetic layer and an insulating layer between the first and second magnetic layers, and the defective state is a state in which the insulating layer has a dielectric breakdown.

16. The memory of claim 15, wherein the first and second magnetic layers have magnetization directions respectively in a direction in which the first and second magnetic layers are stacked.

* * * * *